(12) United States Patent
Hwang et al.

(10) Patent No.: US 11,668,744 B2
(45) Date of Patent: Jun. 6, 2023

(54) CONTACT AND SOCKET DEVICE FOR BURNING-IN AND TESTING SEMICONDUCTOR IC

(71) Applicants: HICON CO., LTD., Seongnam-si (KR); Dong Weon Hwang, Seongnam-si (KR); Logan Jae Hwang, Beverly Hills, CA (US); Jae Baek Hwang, Seoul (KR)

(72) Inventors: Dong Weon Hwang, Seongnam-si (KR); Logan Jae Hwang, Beverly Hills, CA (US); Jae Baek Hwang, Seoul (KR)

( * ) Notice: Subject to any disclaimer, the term of this patent is extended or adjusted under 35 U.S.C. 154(b) by 0 days.

(21) Appl. No.: 17/551,007

(22) Filed: Dec. 14, 2021

(65) Prior Publication Data

US 2022/0196727 A1 Jun. 23, 2022

(30) Foreign Application Priority Data

Dec. 18, 2020 (KR) ........................ 10-2020-0178794

(51) Int. Cl.
 G01R 31/28 (2006.01)
 H01L 21/66 (2006.01)
(52) U.S. Cl.
 CPC ..... *G01R 31/2863* (2013.01); *G01R 31/2865* (2013.01); *G01R 31/2879* (2013.01); *H01L 22/14* (2013.01)
(58) Field of Classification Search
 CPC .............. G01R 1/0466; G01R 1/07314; G01R 31/2879; G01R 31/2886; G01R 31/2889; G01R 31/2896
 See application file for complete search history.

(56) References Cited

U.S. PATENT DOCUMENTS

| 2008/0315893 | A1* | 12/2008 | Osato | ................. | G01R 1/06716 |
| | | | | | 324/537 |
| 2009/0298307 | A1 | 12/2009 | Rikimaru et al. | | |
| 2021/0102973 | A1* | 4/2021 | Hwang | .............. | G01R 1/07314 |

FOREIGN PATENT DOCUMENTS

| JP | 2007-139711 A | 6/2007 |
| JP | 2009-2845 A | 1/2009 |
| KR | 10-2008-0005738 A | 1/2008 |
| KR | 10-2011-0051668 A | 5/2011 |
| KR | 10-2014-0078835 A | 6/2014 |
| KR | 10-2015-0002981 A | 1/2015 |
| KR | 10-2016-0092366 A | 8/2016 |
| KR | 10-2172785 B1 | 10/2020 |
| TW | 202027346 A | 7/2020 |

* cited by examiner

*Primary Examiner* — Tung X Nguyen

(57) ABSTRACT

A contact for burning-in and testing a semiconductor IC and a socket device including the contact are proposed. The contact includes: an upper terminal part (111) having an upper tip part (111b) at an upper end part thereof; a lower terminal part (112) having a lower tip part (112c) at a lower end part thereof and provided on the same axis as the upper terminal part (111); and an elastic part (113) elastically supporting the upper terminal part (111) and the lower terminal part (112), wherein the upper terminal part (111) and the lower terminal part (112) include a shoulder part (111a) and a shoulder part (112a), respectively, formed by protruding therefrom in width directions thereof, and the elastic part (113) has a third width (w3), and includes a first strip (113a) and a second strip (113b).

50 Claims, 51 Drawing Sheets

CONTACT AND SOCKET DEVICE FOR BURNING-IN AND TESTING SEMICONDUCTOR IC

CROSS REFERENCE TO RELATED APPLICATION

The present application claims priority to Korean Patent Application No. 10-2020-0178794, filed Dec. 18, 2020, the entire contents of which is incorporated herein for all purposes by this reference.

BACKGROUND OF THE INVENTION

Field of the Invention

The present disclosure relates to a contact and a socket device for burning-in and testing a semiconductor IC.

Description of the Related Art

Generally, a socket device for testing a semiconductor device (an integrated circuit, IC) (hereinafter, referred to as IC) is provided on a test board or a burn-in board. The socket device allows a burn-in chamber or a peripheral device thereof inputting and outputting power having a predetermined voltage and electrical signals required for driving the IC and separate test devices for measuring characteristics of the IC to be connected to each other by the input and output terminals of the board, and thus is used in a system for testing the IC.

Among widely used normal ICs, a ball grid array (BGA) type IC remarkably reduces the size and thickness of the IC by arranging terminals of the IC, or balls on the entire bottom surface of the IC. FIGS. 1A and 1B are a top plan view and a side view of the BGA type IC, respectively, and a plurality of ball terminals 2 is provided on the bottom surface of an IC 1.

FIG. 2 is a top plan view of a BGA socket device provided with a pinch type contact of a conventional technology; FIG. 3 is a sectional view taken along line A-A of FIG. 2; and FIG. 4 is a partially enlarged view of FIG. 3.

Referring to FIGS. 2 to 4, the BGA socket device of the conventional technology includes: a contact 16 including a fixed terminal 20 and a movable terminal 21 which are in contact with each of the ball terminals 2 of the BGA type IC; a main body 17 receiving a body of the contact 16; a stopper 18 provided on the lower end of the main body 17 and fixing the contact 16 thereto; a lead guide 19 guiding the position of the lead of the contact 16; a cover 11 elastically supported on the upper side of the main body 17 and provided to move vertically within a predetermined stroke range relative to the main body 17; the slider 15 provided on the main body 17 and moving horizontally by operating in cooperation with the vertical movement of the cover 11 so as to open and close the movable terminal 21; a plurality of IC holders 14 assembled rotatably with the slider 15 and pressing and fixing the upper side of the IC according to the vertical movement of the cover 11; and holder springs 13 provided in the slider 15 and elastically supporting the IC holders 14.

The contact 16 provided symmetrically at the opposite sides of the IC 1 and is provided with the fixed terminal 20 and the movable terminal 21 to be in contact with the ball terminal 2, wherein the lower ends of the fixed terminal 20 and the movable terminal 21 are fixed to a terminal body 24 and a lead 25 is provided by extending from the terminal body 24. The lead 25 is soldered to a PCB (not shown).

The cover 11 is elastically supported on the upper side of the main body 17 by a spring 9 and can move vertically within a predetermined distance range, and is provided with a slide cam horizontally operating the slider 15 according to a vertical position of the cover 11.

The slider 15 has a terminal hole 23 formed therein such that the two terminals 20 and 21 of the contact 16 fixed vertically to the main body 17 are located in the terminal hole 23 by being inserted therethrough. In this case, the terminal hole 23 is provided with a mover 22 partitioning between the fixed terminal 20 and the movable terminal 21.

Particularly, Referring to FIG. 5, when the cover is pressed downward, the slider 15 is moved rightward by the slide cam of the cover. In this case, the mover 22 is moved together with the slider 15, and pushes the movable terminal 21 in a direction away from the fixed terminal 20, so the ball terminal of the IC can be located between the fixed terminal 20 and the movable terminal 21. Meanwhile, at an initial position of the slider 15, a distance between the fixed terminal 20 and the movable terminal 21 between which the mover 22 is located is designed to be smaller than the size of the ball terminal. Reference numeral 12 is an IC guide guiding the position of the IC 1 during the loading of the IC 1.

FIGS. 5A, 5B, and 5C are views roughly illustrating the operation of the socket device of the conventional technology.

FIG. 5A shows an initial state of the socket device, wherein the cover 11 is located at a predetermined height from the main body 17 by being elastically supported on the upper side of the main body 17, and the fixed terminal 20 and the movable terminal 21 of the contact are in close contact with the mover 22, so a predetermined interval L1 is maintained between the two terminals 20 and 21.

Next, as illustrated in FIG. 5B, when the cover 11 is moved downward by being pressed, the mover 22, together with the slider, is moved to the right side of the drawing, so the movable terminal 21 is moved in the direction away from the fixed terminal 20 and the IC 1 is loaded in the socket device. In this case, the distance L2 between the two terminals 20 and 21 has an interval larger than the diameter of the ball terminal 2.

Finally, as illustrated in FIG. 5C, when the cover 11 is restored to an initial position thereof, the mover 22 is restored to an initial position thereof together with the slider, and the movable terminal 21 is also restored to an initial position thereof, so the fixed terminal 20 and the movable terminal 21 hold the ball terminal 2 therebetween.

The BGA socket device of the conventional technology configured as described above has the following problems.

1. Overall, there are many complicated components, so it takes much assembly time and manufacturing cost is high.

2. When the IC is loaded, the IC guide or the cover surrounds the IC, so an air flow is not efficient and heat generated by the IC is not effectively discharged to surroundings.

3. The height of the socket including the cover that is manipulated up and down from the top of the socket is high, and the entire height of a burn-in board is high. Accordingly, when it is required that inside a burn-in chamber, several burn-in boards are arranged in a vertical direction and appropriate air between the burn-in boards flows, the number of the burn-in boards which can be arranged is decreased.

4. The forced flow of air generated in the burn-in chamber is obstructed by the cover or the IC guide, which is a part of the socket, and the air is not effectively transmitted to the surface of the IC. Accordingly, it is difficult to maintain the even temperature of the IC.

5. In the pinch type contact, the contact or release of the contact with the ball terminal is performed by horizontal manipulation of the movable terminal. In this case, the movable terminal undergoes repetitive elastic deformation, and a contact force of the contact with the ball terminal decreases due to decrease in durability due to repeated use. Particularly, in the BGA socket device of the conventional technology, in the process of restoring the movable terminal (see FIG. 5C), the restoration of the slider to an initial position is performed by the elastic restoring force of the movable terminal. Accordingly, as the number of uses of the movable terminal increases, the elastic restoring force of the movable terminal gradually decreases due to the stress of the movable terminal. Accordingly, the contact force of the contact with the ball terminal is decreased, which leads to decrease in the reliability of the test of the IC.

Typically, the pinch type BGA socket device is required to have a life span of approximately 20,000 cover cycles. Accordingly, improving the durability of the terminal of the pinch type contact such that the elastic restoring force of the terminal is prevented from being decreased during the repetitive use of the pinch type contact is very important in determining the test reliability of the BGA socket device.

Document of Related Art (Patent Document 1) Korean Patent Application Publication No. 10-2011-0051668 (published on May 18, 2011)

SUMMARY OF THE INVENTION

Accordingly, the present disclosure has been made keeping in mind the above problems occurring in the related art, and the present disclosure is intended to propose a socket device for burning-in and testing a semiconductor IC, which is a lidless type socket device removing a cover provided on the upper side of a socket body for the loading/unloading of an IC in the conventional technology and has a structure capable of being tested while the semiconductor IC (hereinafter, referred to as "IC") loaded in the socket body is exposed to the outside.

In addition, the present disclosure is intended to propose a contact suitable for such a socket device which has length shorter than the length of a contact of the conventional technology.

In order to achieve the above objectives, according to a first aspect of the present disclosure, there is provided a contact for testing a semiconductor IC, the contact being configured as one strip plate having predetermined width and thickness, the contact including: an upper terminal part having an upper tip part at an upper end part thereof; a lower terminal part having a lower tip part at a lower end part thereof and provided on the same axis as the upper terminal part; and an elastic part elastically supporting the upper terminal part and the lower terminal part, wherein each of the upper terminal part and the lower terminal part includes a shoulder part formed by protruding therefrom in a width direction thereof, and the elastic part has a third width larger than a first width of the upper terminal part and a second width of the lower terminal part, and includes a first strip and a second strip longitudinally famed along a center axis (a z axis) of the elastic part with a slot having a fourth width formed therebetween, wherein each of the first strip and the second strip has a same fifth width and is formed to be curved in a thickness direction opposite to each other, and the fifth width is the same as or larger than the thickness of the strip plate and is the same as or smaller than the fourth width.

According to a second aspect of the present disclosure, there is provided a contact for testing a semiconductor IC, the contact being configured as one strip plate having predetermined width and thickness, the contact including: an upper terminal part having an upper tip part at an upper end part thereof; a lower terminal part having a lower tip part at a lower end part thereof and provided on the same axis as the upper terminal part; and an elastic part elastically supporting the upper terminal part and the lower terminal part, wherein each of the upper terminal part and the lower terminal part includes a shoulder part famed by protruding therefrom in a width direction thereof, and the elastic part has a third width larger than a first width of the upper terminal part and a second width of the lower terminal part, and includes a first strip and a second strip longitudinally famed along a center axis (a z axis) of the elastic part with a slot having a fourth width formed therebetween, wherein each of the first strip and the second strip has a same fifth width and is formed to be curved in a same thickness direction thereof, and the fifth width is the same as or larger than the thickness of the strip plate and is the same as or smaller than the fourth width.

Preferably, the upper tip part or the lower tip part may have at least one pointed contact point.

Preferably, the upper terminal part or the lower terminal part may be formed to have a hollow cylindrical shape by rolling and bending the plate, and the upper tip part or the lower tip part may have a plurality of contact points formed by pointedly protruding along a circumference of an end part of a cylinder of the corresponding upper terminal part or lower terminal part.

Preferably, the lower tip part may be longer than the upper tip part.

Preferably, the lower terminal part may have a handling hole formed therethrough.

Next, a socket device for testing the semiconductor IC including the contact according to the first aspect of the present disclosure may include: a main body part having a first receiving hole formed therein, wherein the first receiving hole may allow the upper tip part to be inserted therethrough and to be located to protrude therefrom and may allow the contact to be compressed and moved downward; and a lower plate assembled with a lower end of the main body part and having a second receiving hole formed at a position corresponding to the first receiving hole, the second receiving hole allowing the lower tip part to protrude downward from the lower plate and to be held therein.

In addition, the socket device including the contact according to the second aspect of the present disclosure may include: a main body part having a first receiving hole formed therein and a plurality of mounting parts fixed to a printed circuit board (PCB), wherein the first receiving hole may allow the upper tip part to be inserted therethrough and to be located to protrude therefrom and may allow the contact to be compressed and moved downward; the lower plate assembled with a lower end of the main body part and having a second receiving hole formed at a position corresponding to the first receiving hole, the second receiving hole allowing the lower tip part to protrude downward from the lower plate and to be held therein; a floating plate having a contact hole formed at a position corresponding to the first receiving hole such that the upper terminal part is located in the contact hole, the floating plate being located to be spaced apart from an upper end of the main body part; and a plurality of floating springs elastically supporting the main body part and the floating plate.

A socket device for testing a semiconductor IC according to a third aspect of the present disclosure includes: a contact including: an upper terminal part having an upper tip part at an upper end part thereof; a lower terminal part having a lower tip part at a lower end part thereof and being assembled with the upper terminal part by crossing each other in a longitudinal direction of the contact; and a spring fitted over the upper terminal part and the lower terminal part therebetween and elastically supporting the upper terminal part and the lower terminal part; a main body part having a first receiving hole formed therein and a plurality of mounting parts fixed to a printed circuit board (PCB), wherein the first receiving hole allows the upper tip part to be inserted therethrough and to be located to protrude therefrom and allows the contact to be compressed and moved downward; the lower plate assembled with a lower end of the main body part and having a second receiving hole formed at a position corresponding to the first receiving hole, the second receiving hole allowing the lower tip part to protrude downward from the lower plate and to be held therein; a floating plate having a contact hole formed at a position corresponding to the first receiving hole such that the upper terminal part is located in the contact hole, the floating plate being located to be spaced apart from an upper end of the main body part; and a plurality of floating springs elastically supporting the main body part and the floating plate.

Preferably, the socket device may further include: an IC holding part provided transversely on each of opposite ends of an upper side of the floating plate such that the IC holding part is elastically slidable, so that the IC holding part elastically supports each of opposite ends of the semiconductor IC loaded and seated on the floating plate.

Preferably, each of the mounting parts may be formed by protruding and extending from a lower part of the main body part and may have a column shape.

Preferably, the mounting part may include: a through hole formed therethrough; a groove formed by cutting in a lower end part thereof; and a removal prevention protrusion formed on an outer circumferential surface thereof by protruding therefrom.

More preferably, the socket device may further include: a rivet pin inserted into the through hole.

Preferably, the socket device may further include: a cover part elastically supported on an upper part of the main body part and capable of moving vertically, and a pair of pressing means provided to be horizontally symmetrical to each other relative to the main body part and pressing the IC by operating in cooperation with the vertical movement of the cover part, wherein each of the pressing means may include: a pusher configured to be in surface contact with and to press an upper surface of the IC sitting on the floating plate; a link assembled rotatably with the main body part by the first hinge shaft at a first end thereof and assembled rotatably with the pusher by a second hinge shaft at a second end thereof; and a latch assembled rotatably with the cover part by a third hinge shaft at a first end thereof and configured to be rotated by the second hinge shaft commonly used at a second end thereof, the latch being assembled rotatably with the pusher by a fourth hinge shaft spaced apart from the second hinge shaft.

Preferably, the socket device may further include: a base having a hinge part at a first end thereof and a latch holding step at a second thereof, the base being fixed to the main body part; a socket lid assembled rotatably with the hinge part and having a latch provided rotatably therein, the latch being held in the latch holding step; and a pusher provided in the socket lid and pressing an upper surface of the semiconductor IC.

More preferably, the socket device may further include: a plurality of push springs provided between the socket lid and the pusher so as to allow the pressing force of the pusher to be applied.

More preferably, the pusher may include a heat discharge part on an upper surface thereof, the heat discharge part being configured to discharge heat, and the main body part may further include an insert nut such that the main body part is mounted to the PCB.

More preferably, the floating plate may include an IC seating guide part having a guide surface guiding a seating position of the IC.

More preferably, the main body part may be integrated with the base, and the floating plate may include a ball terminal receiving hole formed to expand upward from the contact hole such that a terminal of the semiconductor IC is located in the ball terminal receiving hole.

The socket device of the present disclosure is a lidless type socket device removing a cover which is a component necessary for the conventional socket device and is provided on the upper side of the socket body for the loading/unloading of the IC, thereby minimizing the size of the socket device and decreasing the height of the socket device up to a half of the height of the socket device of the conventional technology.

Accordingly, the socket device of the present disclosure has increased space efficiency inside a test equipment, or inside a test chamber or a burn-in chamber. Particularly, the length of the contact provided in the socket device is relatively short, thereby enabling a higher speed test. Furthermore, the top surface of the IC is exposed to the upper surface of the socket device, and a heat source increasing/decreasing the temperature of the IC provided on the upper side of the socket device can be directly in contact with the top surface of the IC to directly control the temperature of the IC. In addition, a contact and a socket device for burning-in and testing a semiconductor IC of the present disclosure allow the top surface of the IC to be tested by being pressed, and can be used in artificial intelligence and driverless cars that require high reliability in the future.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1A:
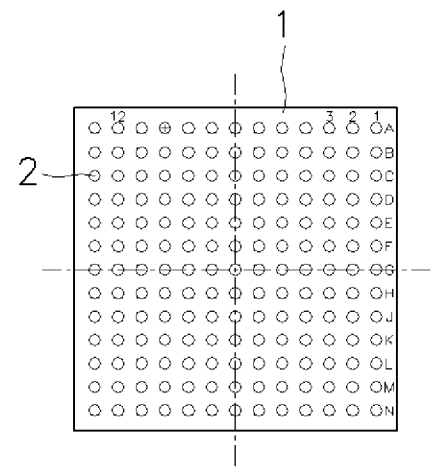
FIGS. 1A and 1B are a top plan view and a side view of a BGA type IC, respectively.
Figure 1B:
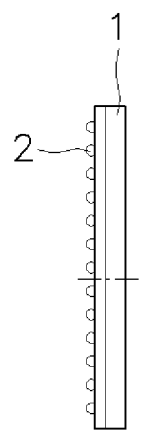
Figure 2:
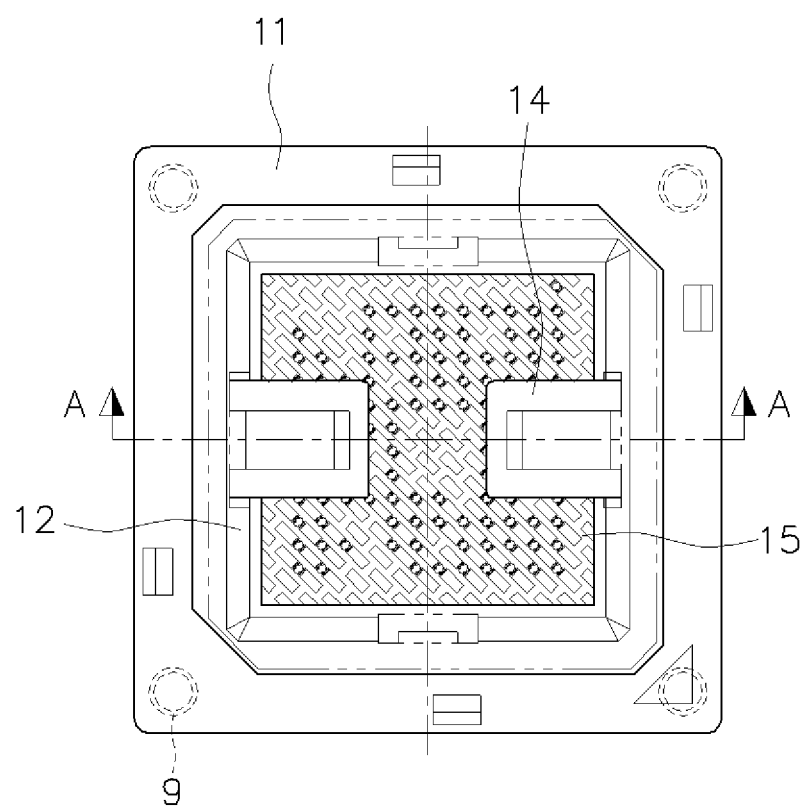
FIG. 2 is a top plan view of a socket device of a conventional technology.
Figure 3:
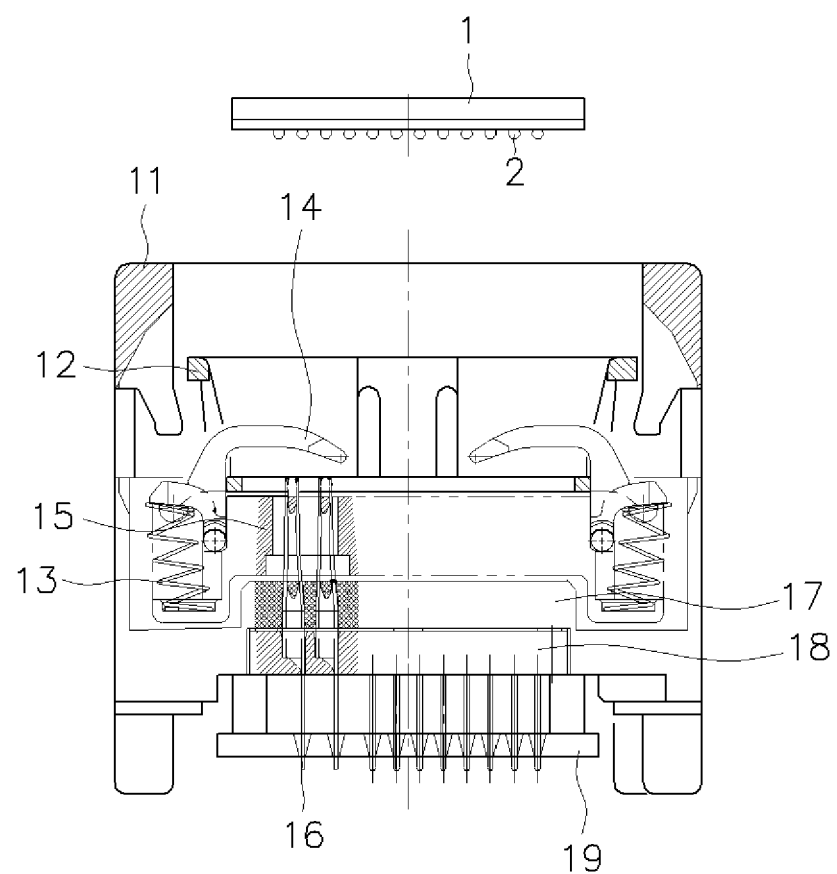
FIG. 3 is a sectional view taken along line A-A of FIG. 2.
Figure 4:
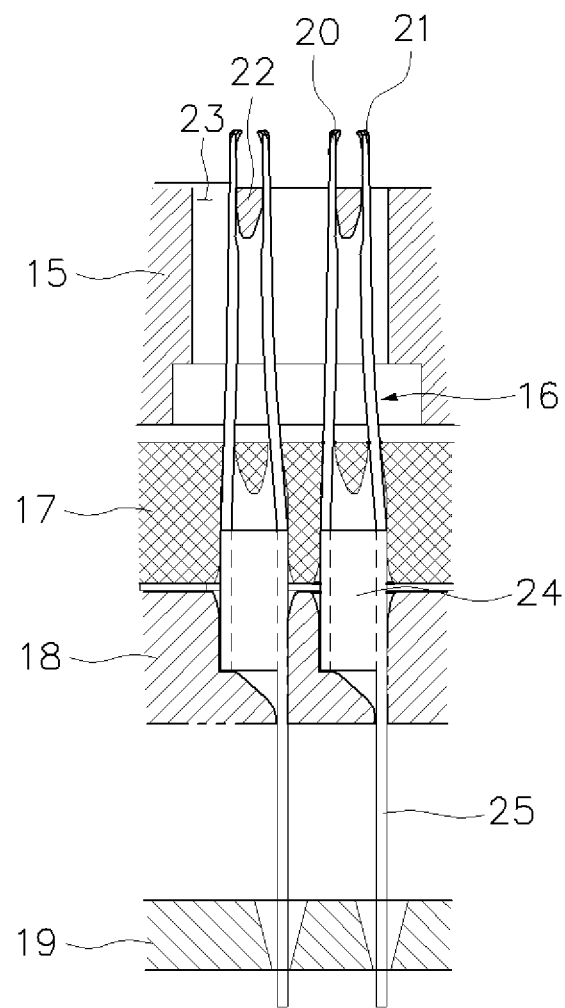
FIG. 4 is a partially enlarged view of FIG. 3.
Figure 5A:
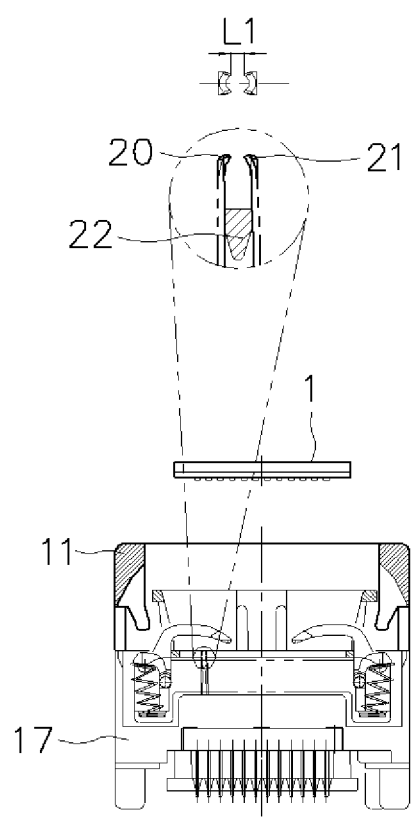
FIGS. 5A, 5B, and 5C are views roughly illustrating the operation of the socket device of the conventional technology.
Figure 5B:
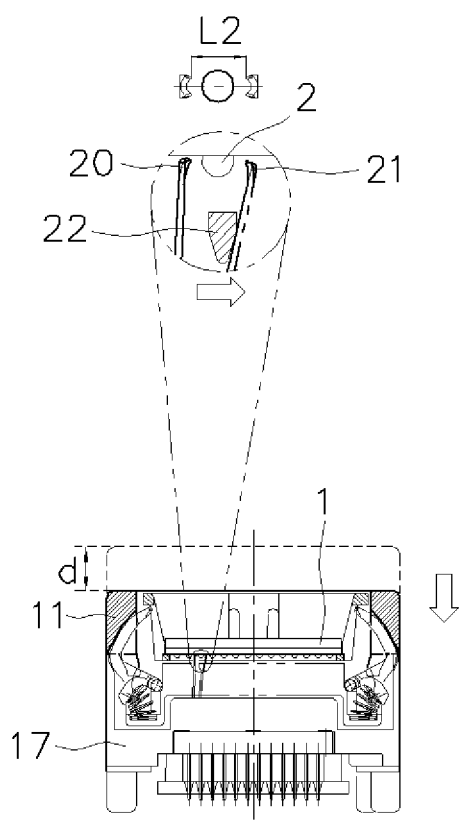
Figure 5C:
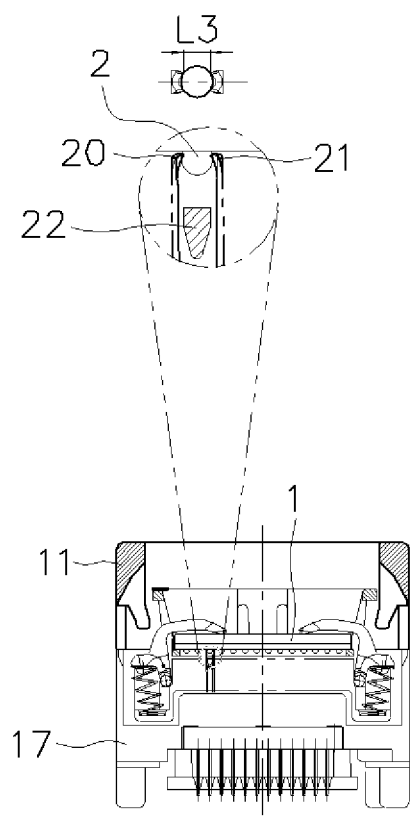

Unless otherwise defined, terms or words used in the specification and claims are not limited to meanings that are commonly understood or are defined in dictionaries, and should be interpreted as having meanings and concepts that are consistent with the context of the present disclosure, based on the principle that an inventor may properly define concepts of words so as to describe his or her invention in the best mode.

Accordingly, since the exemplary embodiment of the present disclosure and configurations of the drawings have been disclosed for illustrative purposes and do not represent all of the technological spirit of the present disclosure, those skilled in the art will appreciate that various modifications, additions and substitutions are possible without departing from the scope and spirit of the invention as disclosed in the accompanying claims.

Hereinafter, the embodiments of the present disclosure will be described in detail with reference to the accompanying drawings. For multiple identical components, a reference numeral is indicated for only one component, and an identified reference numeral is used only when a separately identified explanation is required.

Figure 6:
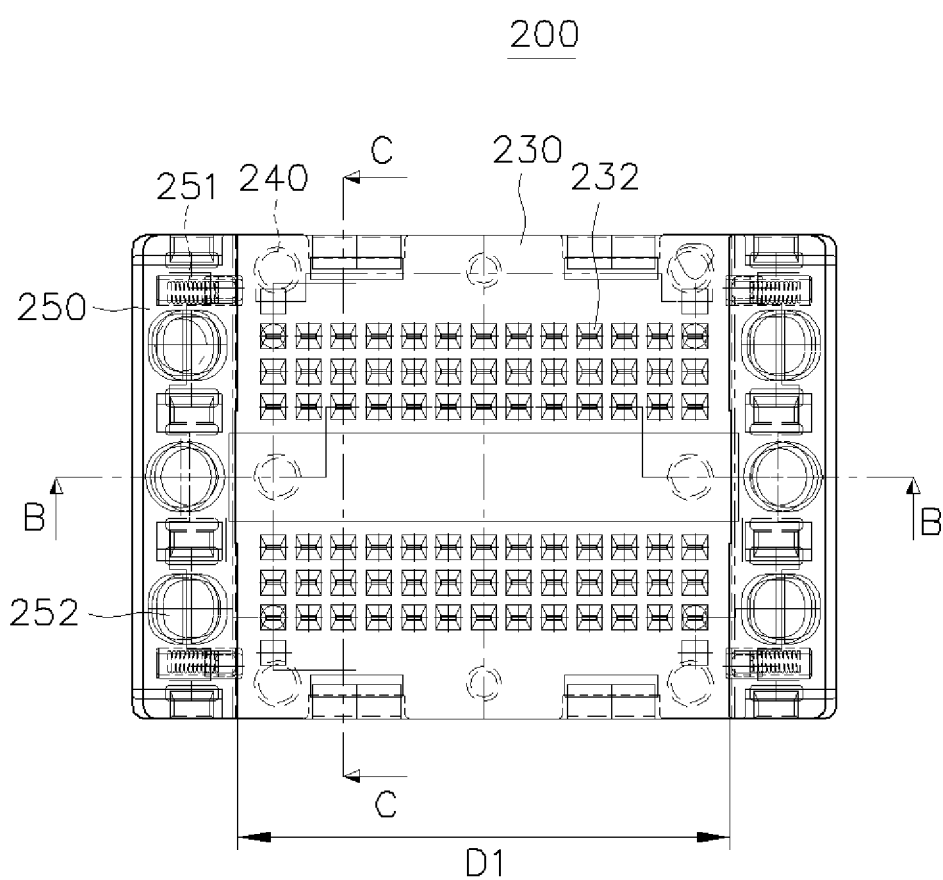
FIG. 6 is a top plan view of a socket device according to a first embodiment of the present disclosure.
Figure 7:
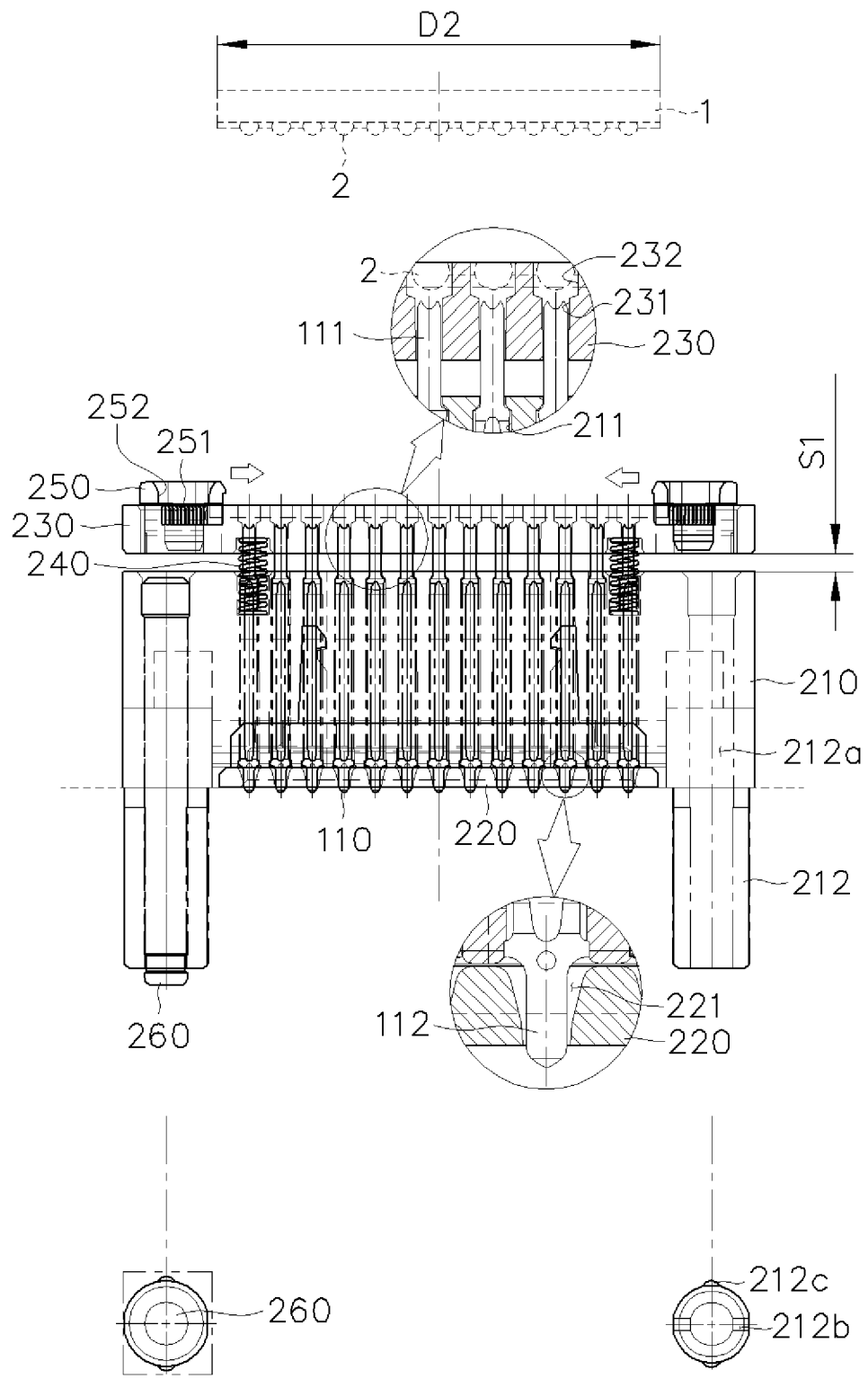
FIG. 7 is a sectional view taken along line B-B of FIG. 6.

FIG. 6 is a top plan view of a socket device according to a first embodiment of the present disclosure; FIG. 7 is a sectional view taken along line B-B of FIG. 6; and FIG. 8 is a cross-sectional view taken along line C-C of FIG. 6.

Figure 8:
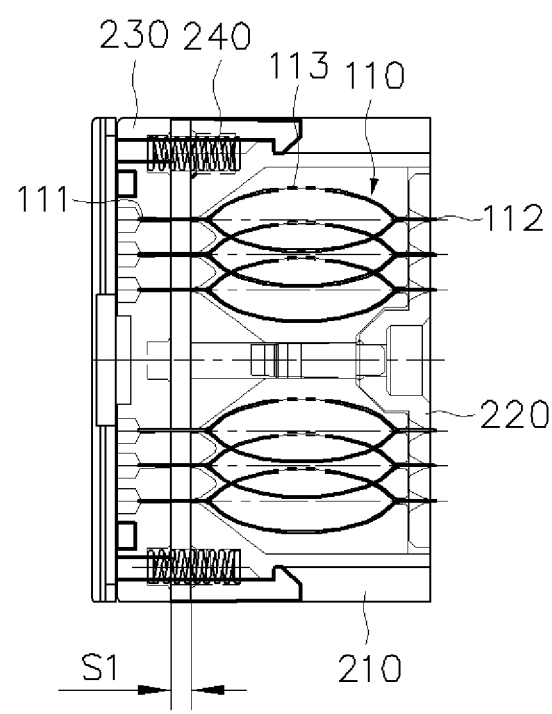
FIG. 8 is a cross-sectional view taken along line C-C of FIG. 6.

Referring to FIGS. 6 to 8, the socket device 200 for testing a semiconductor IC according to the embodiment includes: contacts 110; a main body part 210 having first receiving holes 211 formed therein and a plurality of mounting parts 212 fixed to a PCB, wherein each of the first receiving holes allows an upper end of each of the contacts 110 to be inserted therethrough and allows the contact to be compressed and moved downward; a lower plate 220 assembled with a lower end of the main body part 210 and having a second receiving hole 221 formed at a position corresponding to the first receiving hole 211, the second receiving hole allowing a lower terminal part 122 of the contact 110 to be inserted therethrough; a floating plate 230 having a contact hole 231 formed at a position corresponding to the first receiving hole 211 and located to be spaced apart from the upper end of the main body part 210, wherein the upper end of the contact 110 is located in the contact hole 231; and a plurality of floating springs 240 elastically supporting the main body part 210 and the floating plate 230.

The contact 110 includes: an upper terminal part 111 electrically connected to a terminal of the IC or a terminal of the PCB; the lower terminal part 112 provided on the same axis as the upper terminal part 111 and electrically connected to the terminal of the PCB; and an elastic part 113 elastically supporting the upper terminal part 111 and the lower terminal part 112 in an axial direction thereof therebetween. The specific embodiment of the contact 10 will be described in detail again in the related drawings.

The contact 110 is inserted between the main body part 210 and the lower plate 220 and is in contact with the ball terminal 2 in the process of the loading of the IC 1. In the process, the upper terminal part 111 is compressed and moved downward and the elastic part 113 is compressed in the axial direction. During the unloading of the IC 1, the upper terminal part 111 is moved upward by the restoring force of the elastic part 113, and the height of the upward movement of the upper terminal part 111 in the first receiving hole 211 is limited.

Particularly, referring to FIG. 7, the main body part 210 has the mounting parts 212 formed thereon by protruding downward therefrom such that the main body part 210 is mounted to the PCB. Each of such mounting parts 212 may have the shape of a cylinder or polygonal column. Preferably, the mounting part 212 includes: a through hole 212a formed therethrough along a longitudinal direction thereof; a groove 212b formed by cutting up to a predetermined height from the lower end part of the mounting part; and a removal prevention protrusion 212c formed on an outer circumferential surface thereof by protruding therefrom such that a distal end part of the mounting part 212 may be securely press-fitted into the mounting hole of the PCB.

Preferably, the mounting part 212 may further include a rivet pin 260 inserted into the through hole 212a. The rivet pin 260 is press-fitted into the through hole 212a after the removal prevention protrusion 212c is fixed in the mounting hole of the PCB, so the mounting part 212 can be prevented from being loosened in the PCB due to the inward contraction and deformation of the removal prevention protrusion 212c. For reference, in FIG. 7, to aid understanding, the rivet pin 260 is illustrated to be inserted into only the mounting part 212 located at a left side.

The floating plate 230 is located to be spaced apart by a predetermined height S1 from the main body part 210 by each of the plurality of floating springs 240, and the upper terminal part 111 is located in the contact hole 231. In FIG. 6, the floating spring 240 has multiple floating springs arranged in the floating plate 230, and may be increased or decreased in number within a range capable of stably supporting the floating plate 230.

Preferably, the floating plate 230 may include a ball terminal receiving hole 232 formed to expand upward from the contact hole 231 such that the ball terminal 2 of the IC is seated in the ball terminal receiving hole 232. Meanwhile, such a ball terminal receiving hole 232 may be omitted when the terminal of the IC is a terminal of a land grid array (LGA) type IC instead of the ball terminal of a ball grid array (BGA) type IC.

Preferably, the floating plate 230 may further include an IC holding part 250 holding the IC loaded thereon.

The IC holding part 250 is provided horizontally slidably on each of the opposite ends of the upper side of the floating plate 230 and elastically supports each of the opposite ends of the IC 1.

Particularly, as illustrated in FIGS. 6 and 7, the IC holding part 250 is provided at each of the opposite ends of the upper end of the floating plate 230. The IC holding parts 250 are elastically supported inward by holding springs 251 inserted horizontally into the floating plate 230, and an interval D1 between the two IC holding parts 250 is maintained to be smaller than the width D2 of the IC 1 (D1<D2).

After the IC 1 is loaded on the floating plate 230 by pulling the IC holding parts 250 to the outside, the two IC holding parts 250 are restored by an elastic force of each of the holding springs 251 after being pulled to the outside, and tightly push the opposite ends of the IC 1, so the IC 1 is held on the upper surface of the floating plate 230.

The IC holding part 250 has a plurality of first manipulation holes 252 formed vertically therethrough. Each of the first manipulation holes 252 is a hole allowing the IC holding part 250 to be manipulated by an IC loading/unloading device (illustrated in FIGS. 38, 39, and 40) which is an auxiliary device for the loading/unloading of the IC, and will be described again in the related drawing. In FIG. 6, two first manipulation holes 252 are illustrated to be vertically formed in the IC holding part 250 located on each of the opposite sides of the floating plate 230.

Figure 9:
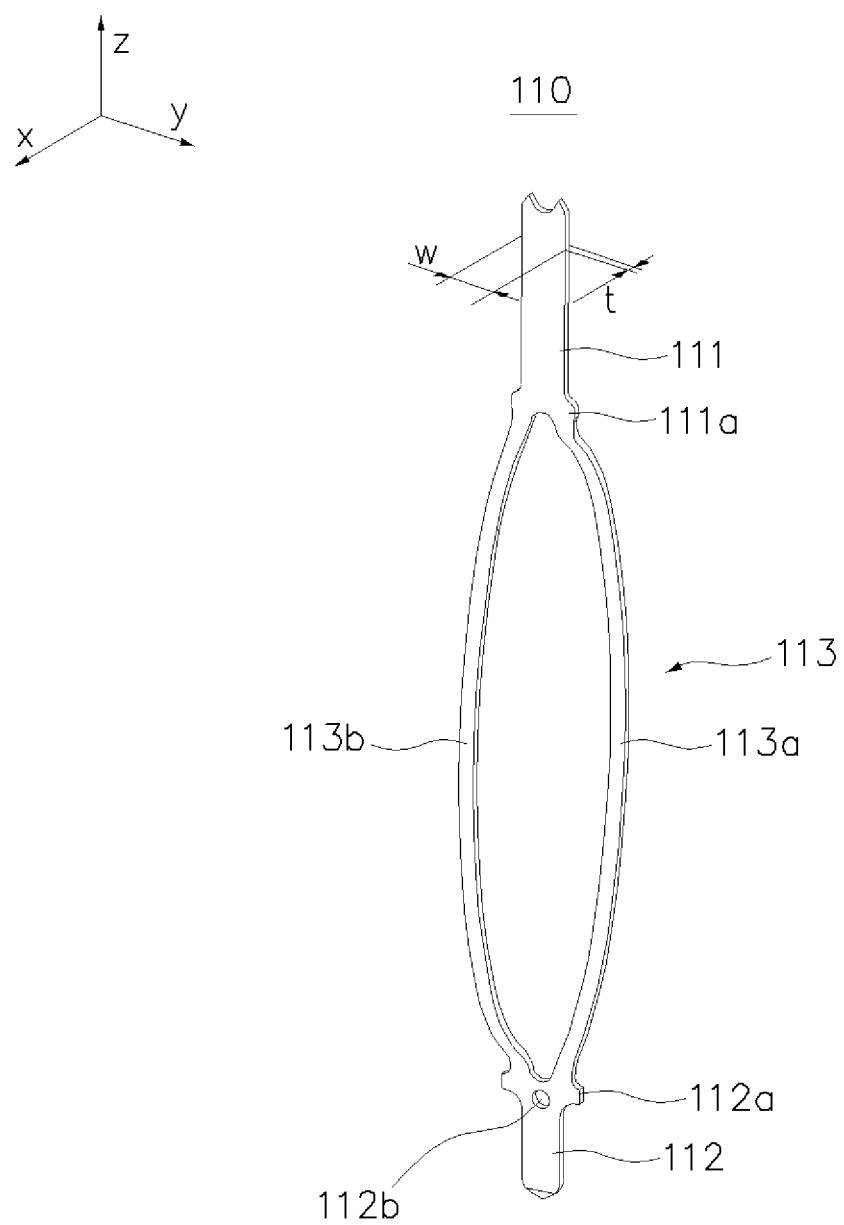
FIG. 9 is a perspective view of a contact according to the first embodiment of the present disclosure.
Figure 10A:
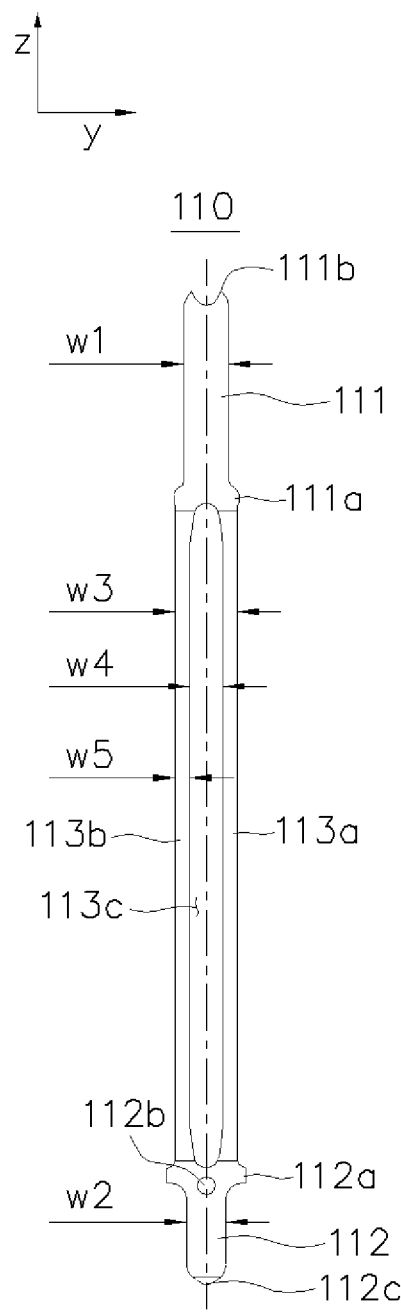
FIGS. 10A and 10B are a front view and a side view of the contact, respectively, according to the first embodiment of the present disclosure.
Figure 10B:
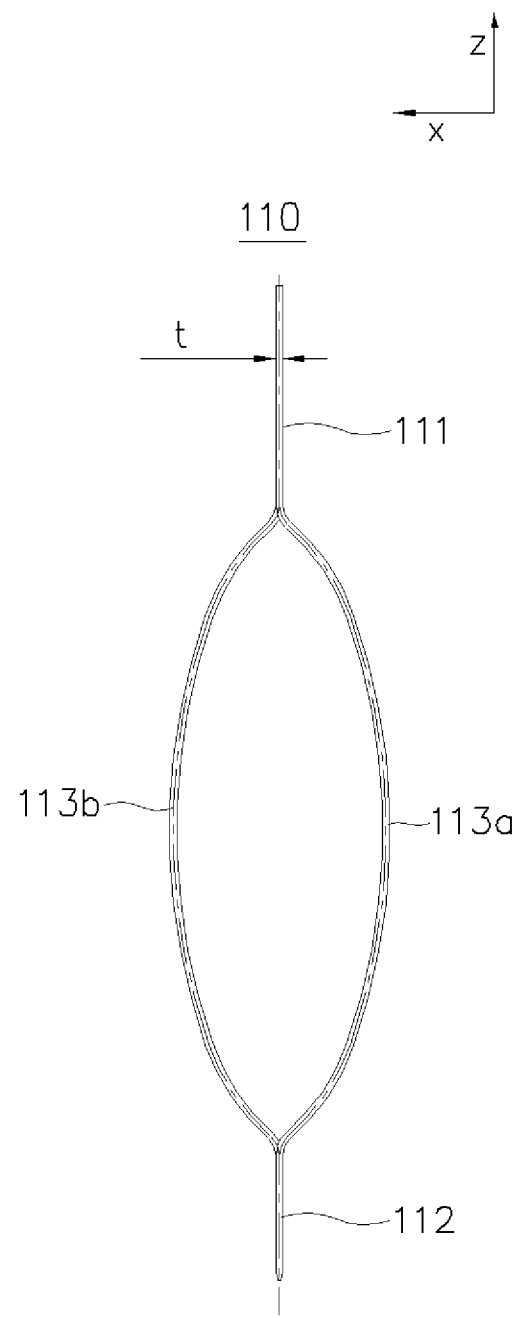

FIG. 9 is a perspective view of the contact according to the first embodiment of the present disclosure, and FIGS. 10A and 10B are a front view and a side view of the contact, respectively, according to the first embodiment of the present disclosure.

Referring to FIG. 9, 10A, and 10B, the contact 110 of the embodiment is composed of the upper terminal part 111, the lower terminal part 112 provided on the same axis (a z-axis) as the upper terminal part 111, and the elastic part 113 elastically supporting the upper terminal part 111 and the lower terminal part 112 therebetween and configured as one strip plate having predetermined width w and thickness t (t<w).

In the embodiment, a first width w1 of the upper terminal part 111 and a second width w2 of the lower terminal part 112 are illustrated to be the same, but may be different from each other. The first width w1 of the upper terminal part 111 or the second width w2 of the lower terminal part 112 is smaller than a third width w3 which is the entire width of the elastic part 113 (w1, w2<w3).

Particularly, in the embodiment, the elastic part 113 has a first strip 113a and a second strip 113b along the center axis (a z axis) thereof, with a slot 113c having a fourth width w4 formed between the first strip 113a and the second strip 113b, wherein the first strip 113a and the second strip 113b have the same fifth widths w5 and are formed to be curved in thickness directions (±x-axis directions) opposite to each other, and each of the fifth widths w5 is the same as or larger than the thickness t of the strip plate, and is the same as or smaller than the fourth width w4.

Meanwhile, in the specification, the fourth width w4 of a slot 113c does not mean a physically spaced distance between the first strip 113a and the second strip 113b, but should be understood to mean a horizontal width between the first strip 113a and the second strip 113b on a plane (i.e. a y-z plane) of the width direction of the slot 113c.

Preferably, the upper terminal part 111 includes an upper shoulder part 111a formed by protruding in the width direction (a y axis) from a joint of a lower end of the upper terminal part 111 connected to the elastic part 113. The lower terminal part 112 may also include a lower shoulder part 112a formed by protruding in the width direction (the y axis) from a joint of an upper end of the lower terminal part connected to the elastic part 113.

Preferably, the lower terminal part 112 may have a handling hole 112b formed therethrough for disassembling or assembling the contact.

The upper terminal part 111 has an upper tip part 111b composed of a plurality of contact points famed on the upper end of the upper terminal part 111, which can increase contact with the ball terminal, and the lower terminal part 112 may also have a plurality of contact points formed at a lower end thereof so as to increase contact with the PCB.

In the embodiment, the lower terminal part 112 includes a lower tip part 112c having one contact point formed on the lower end thereof. The lower tip part 112c may be pointed and sharp like the upper tip part 111b, or may be composed of a plurality of contact points, and may be variously modified to increase contact with the PCB.

Figure 11A:
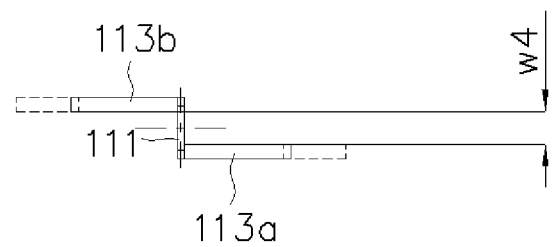
FIGS. 11A and 11B are a top plan view and a side view of the contact, respectively, according to the first embodiment of the present disclosure, FIG. 11B illustrating a vertical operation of the contact.
Figure 11B:
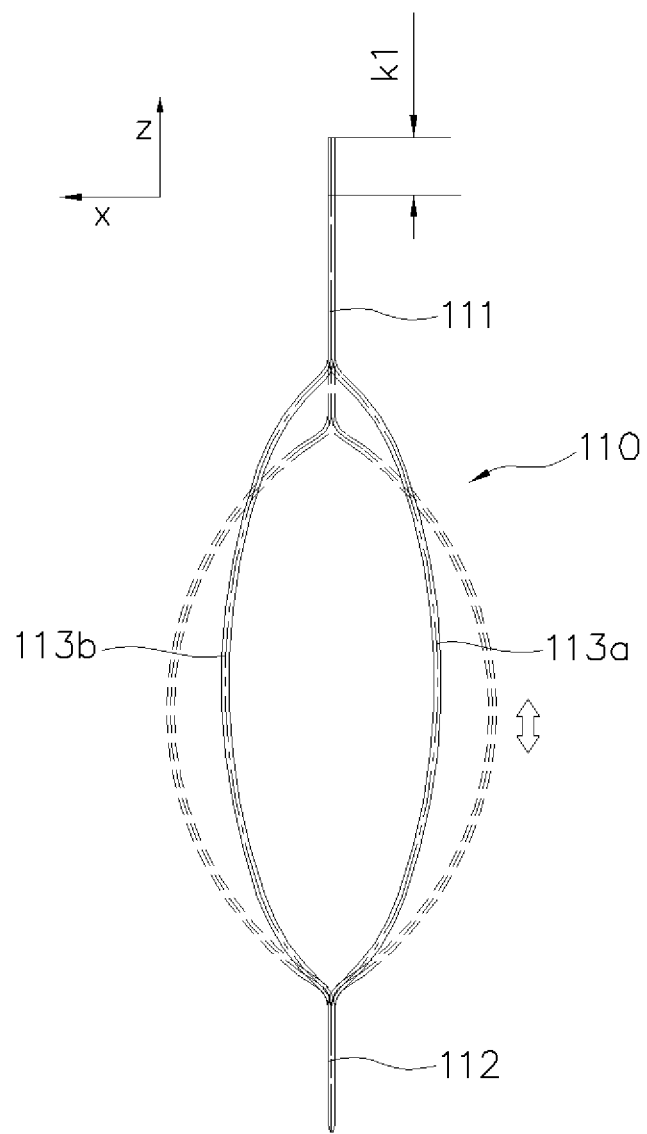

FIGS. 11A and 11B are a top plan view and a side view of the contact, respectively, according to the first embodiment of the present disclosure, and FIG. 11B illustrates a vertical operation of the contact.

Referring to FIGS. 11A and 11B, when the contact 110 of the embodiment is in contact with the terminal of the IC after the IC sits on the socket device, the elastic part 113 is compressed and the upper terminal part 111 is moved downward by a predetermined height k1.

Figure 12A:
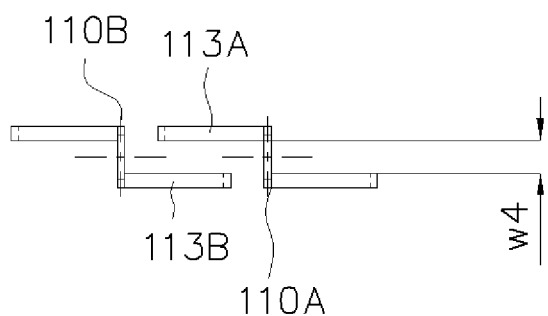
FIGS. 12A and 12B are a top plan view and a side view, respectively, illustrating the arrangement of contacts according to the first embodiment of the present disclosure.
Figure 12B:
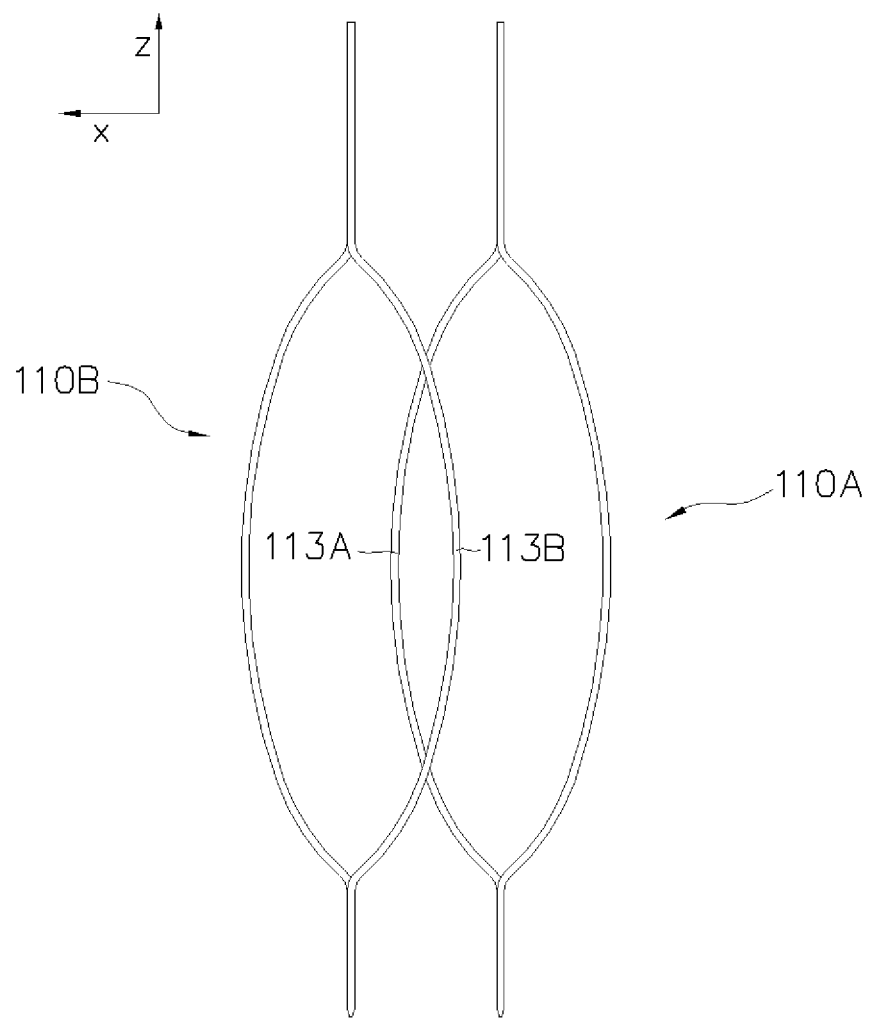

FIGS. 12A and 12B are a top plan view and a side view, respectively, illustrating the arrangement of contacts according to the first embodiment of the present disclosure.

Referring to FIGS. 12A and 12B, in the embodiment, although a plurality of contacts is arranged in a straight line, the contacts can operate without interference with each other, thereby improving space efficiency. For example, when two contacts 110A and 110B are placed in a straight line (on an x-axis), the second strip 113B of a first contact 110A and the first strip 113A of a second contact 110B operate by being spaced apart from each other by the fourth width w4 of the slot, and an electrical short between the adjacent contacts is prevented from occurring. Accordingly, the plurality of contacts is arranged in the straight line and has high density, so the size of the socket device can be reduced.

The contacts of the embodiment configured as described above may be variously modified. Hereinafter, other embodiments will be exemplified and described, but descriptions overlapping with the first embodiment will be omitted, and differences between the respective embodiments will be mainly described.

Figure 13A:
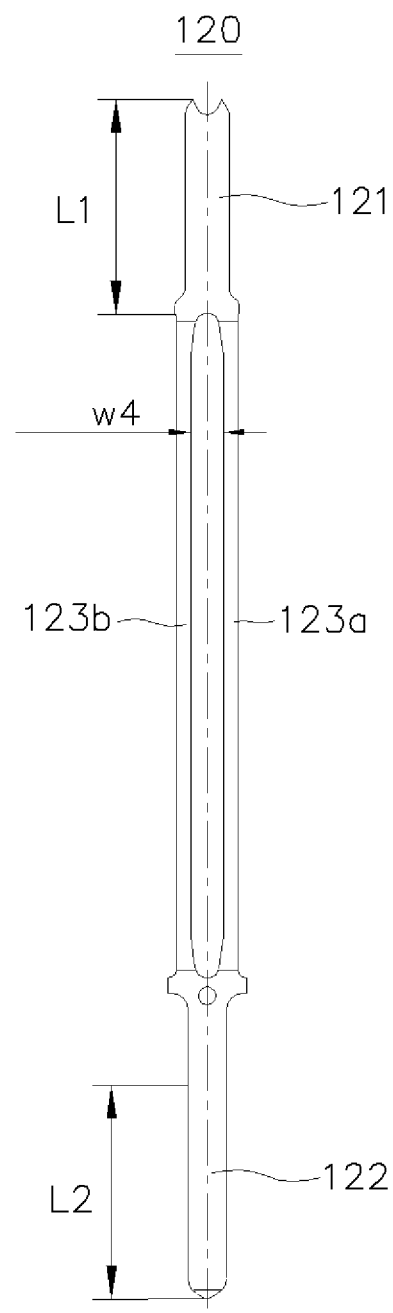
FIGS. 13A and 13B are a front view and a side view of a contact, respectively, according to a second embodiment of the present disclosure.
Figure 13B:
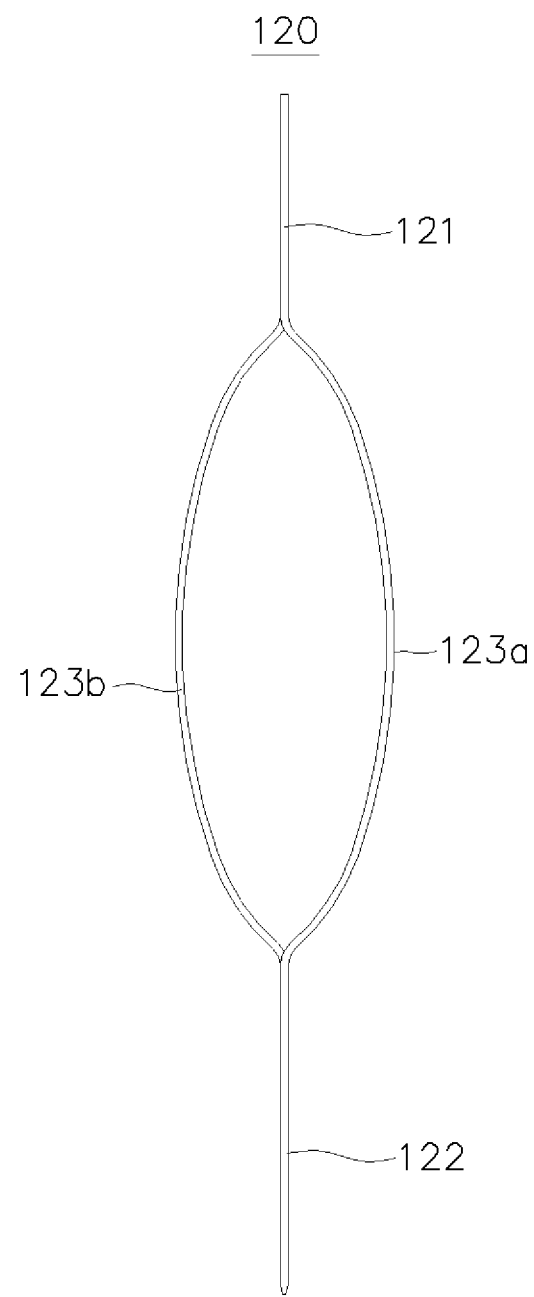

FIGS. 13A and 13B are a front view and a side view of a contact according to a second embodiment of the present disclosure. The contact 120 of the second embodiment is composed of an upper terminal part 121, a lower terminal part 122, and an elastic part 123a and 123b, and is substantially the same as the contact of the first embodiment. Particularly, the lower terminal part 122 is configured to have length L2 longer than the length L1 of the upper terminal part 121 (L1<L2), so in a solder type socket device, the lower terminal part 122 may be soldered directly to the PCB.

Figure 14:
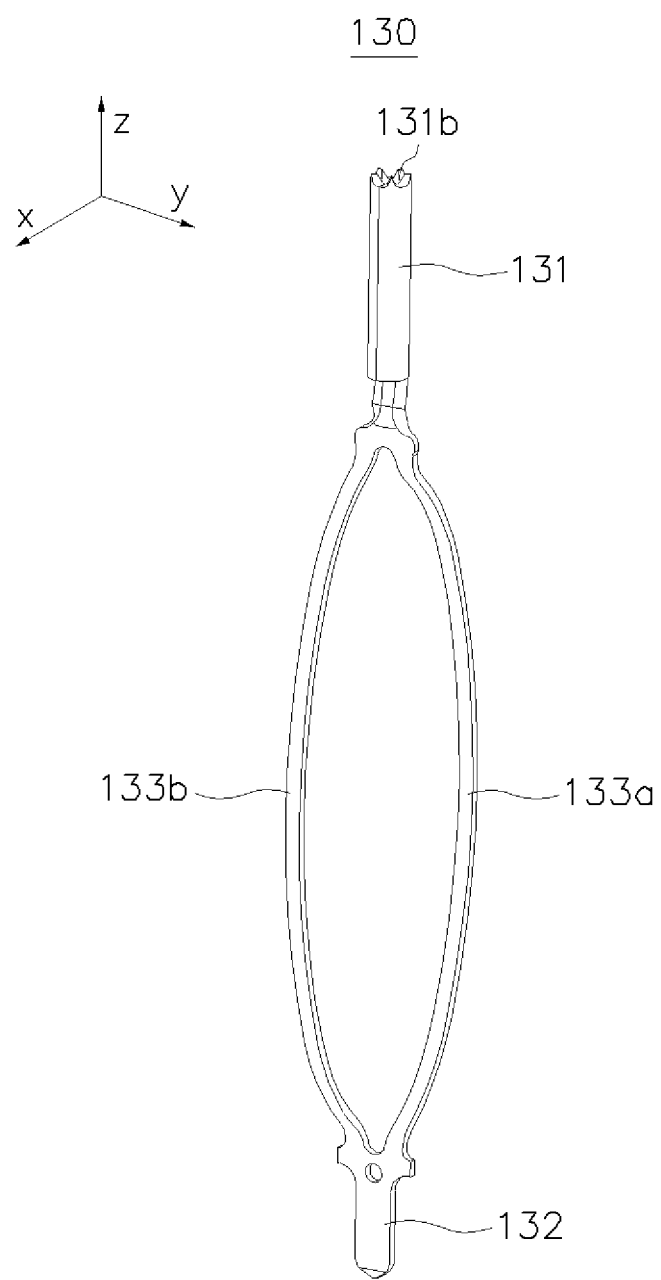
FIG. 14 is a perspective view of a contact according to a third embodiment of the present disclosure.

FIG. 14 is a perspective view of the contact according to a third embodiment of the present disclosure.

Referring to FIG. 14, a contact 130 of the third embodiment is composed of an upper terminal part 131; a lower terminal part 132; and an elastic part 133a and 133b, and is substantially the same as the contact of the first embodiment. Particularly, the upper terminal part 131 may be formed to have a cylindrical shape by rolling and bending the plate, and includes an upper tip part 131b having a plurality of contact points configured as a crown shape formed by pointedly protruding along the circumference of the upper end part of the upper terminal part.

Meanwhile, in the embodiment, only the upper terminal part is illustrated to have a cylindrical shape, but the lower terminal part may be also configured to have a cylindrical shape according to the shape of the terminal (a pad) of the PCB.

Figure 15:
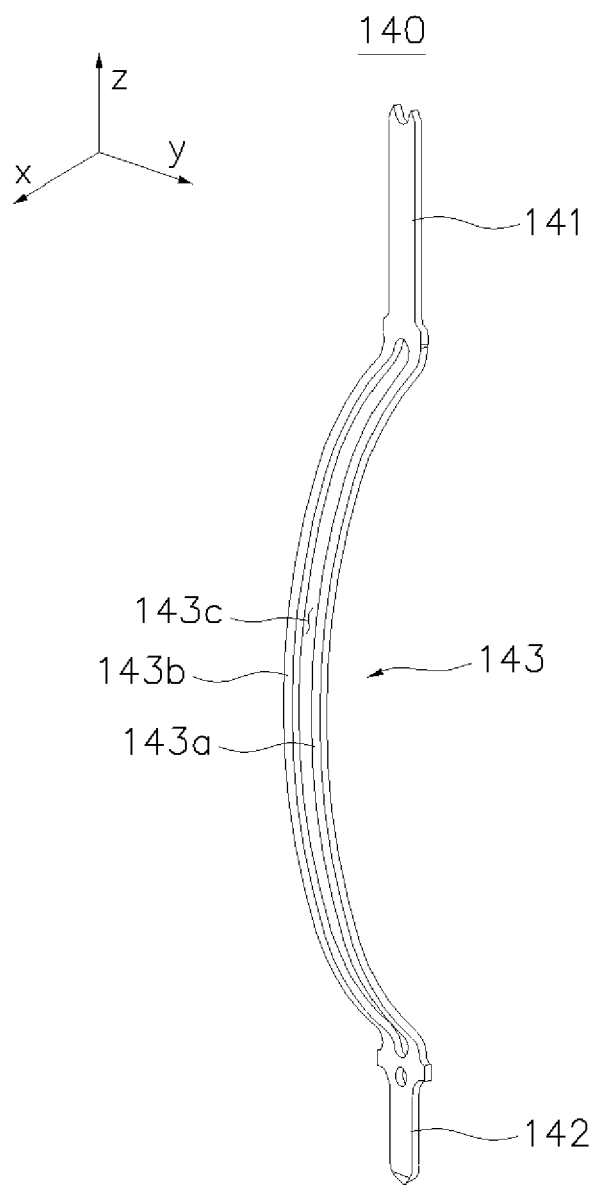
FIG. 15 is a perspective view of a contact according to a fourth embodiment of the present disclosure.

FIG. 15 is a perspective view of a contact according to a fourth embodiment of the present disclosure. The contact 140 of the fourth embodiment is composed of an upper terminal part 141; a lower terminal part 142 provided on the same axis (a z-axis) as the upper terminal part 141; and an elastic part 143 elastically supporting the upper terminal part 141 and the lower terminal part 142 therebetween, the elastic part being configured as one strip plate having predetermined width w and thickness t (t<w) and including a first strip 143a and a second strip 143b having the same thickness with a longitudinal slot 143c therebetween. Such a configuration is the same as the configuration of the contact of the first embodiment described above. Particularly, each of the first strip 143a and the second strip 143b is formed to have a semicircular arched shape in the same thickness direction thereof (a +x-axis direction).

Although the contact 140 having such a configuration has a plurality of contacts arranged in a straight line, the elastic parts of contacts adjacent to each other may be sufficiently spaced apart from each other to prevent an electrical short, and the effective space arrangement of the contacts may be promoted.

Figure 16A:
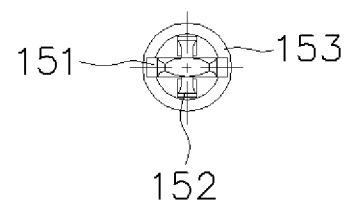
FIGS. 16A, 16B, and 16C are a top plan view, a front view, and a side view of a contact, respectively, according to the fifth embodiment of the present disclosure.
Figure 16B:
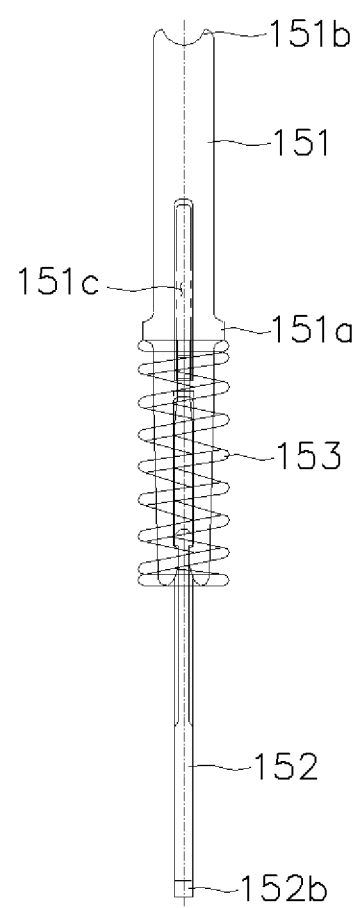
Figure 16C:
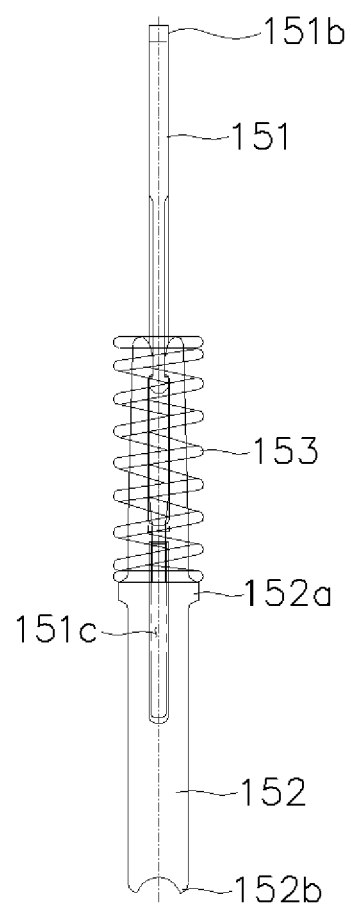
Figure 17:
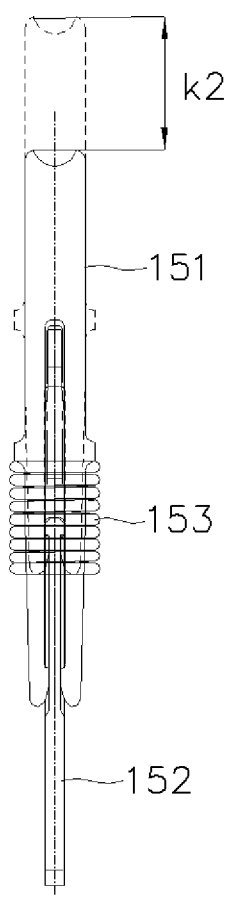
FIG. 17 is a view illustrating the operation of the contact according to the fifth embodiment of the present disclosure.

FIGS. 16A, 16B, and 16C are a top plane view, a front view, and a side view of a contact, respectively, according to a fifth embodiment of the present disclosure, and FIG. 17 is a view illustrating the operation of the contact according to the fifth embodiment of the present disclosure.

Referring to FIGS. 16A, 16B, and 16C, a contact 150 of the fifth embodiment includes an upper terminal part 151 having an upper tip part 151b at an upper end part thereof; a lower terminal part 152 having a lower tip part 152b at a lower end part thereof and being assembled with the upper terminal part 151 by crossing each other in a longitudinal direction of the contact; and a spring 153 fitted over the upper terminal part 151 and the lower terminal part 152 therebetween and elastically supporting the upper terminal part 151 and the lower terminal part 152.

Each of the upper terminal part 151 and the lower terminal part 152 has the same shape, and is formed to have a thickness of a plate in a longitudinal direction thereof. The upper terminal part 151 and the lower terminal part 152 have a first slot 151c and a second slot 152c, respectively, formed therein, and are inserted into the spring 153 by crossing each other by 90° to be assembled with each other.

As illustrated in FIG. 17, the contact 150 of the embodiment has an elastic force against an external force of an axial direction thereof, and while the contact 150 is compressed by a predetermined length k2 by the external force, the contact 150 performs electrical connection between a semiconductor IC or a terminal of a PCB and a terminal of a PCB which are brought into contact with the upper terminal part 151 and the lower terminal part 152, respectively.

Such a spring contact is compressed in the axial direction and can perform the electric contact, and thus can be applied to the socket device of the fifth embodiment in the same way as the contacts of the above embodiments. Furthermore, a brand name "POGO Pin", which is a representative of a conventional spring contact, can also be applied to the socket device of the fifth embodiment.

Hereinafter, each component of the socket device according to the first embodiment of the present disclosure will be described in detail.

Figure 18:
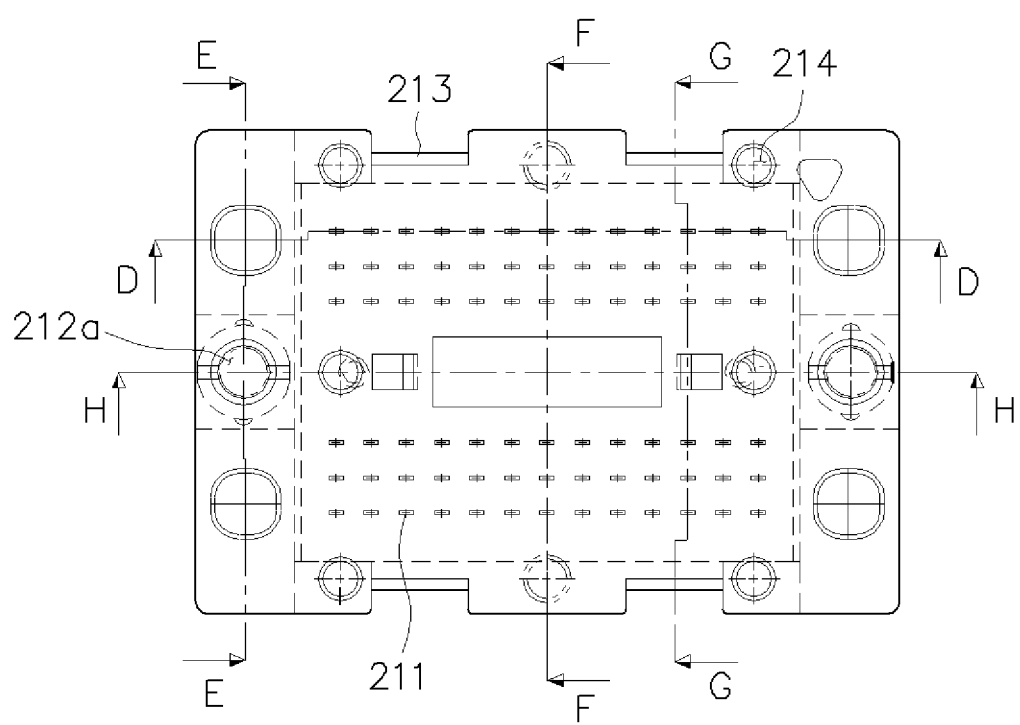
FIG. 18 is a top plan view of a main body part of the socket device according to the first embodiment of the present disclosure.
Figure 19:
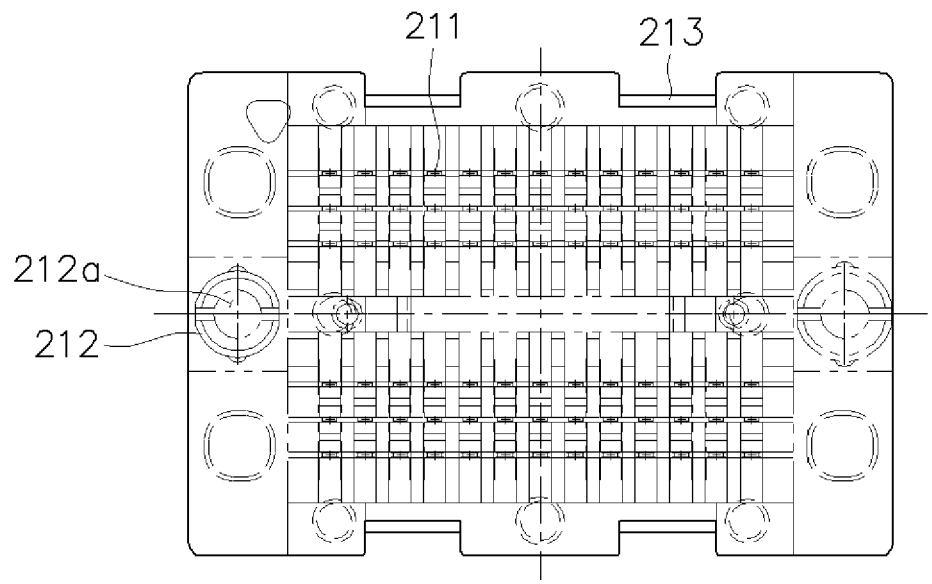
FIG. 19 is a rear view of the main body part of the socket device according to the first embodiment of the present disclosure.
Figure 20:
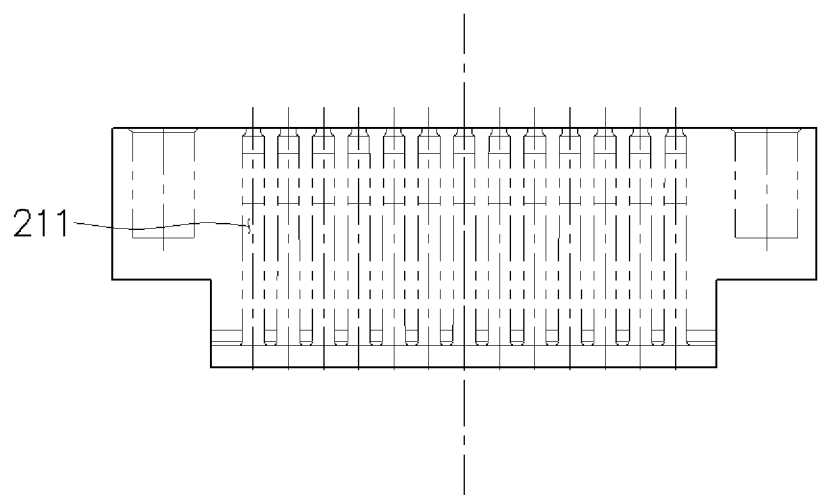
FIG. 20 is a sectional view taken along line D-D of FIG. 18.
Figure 21:
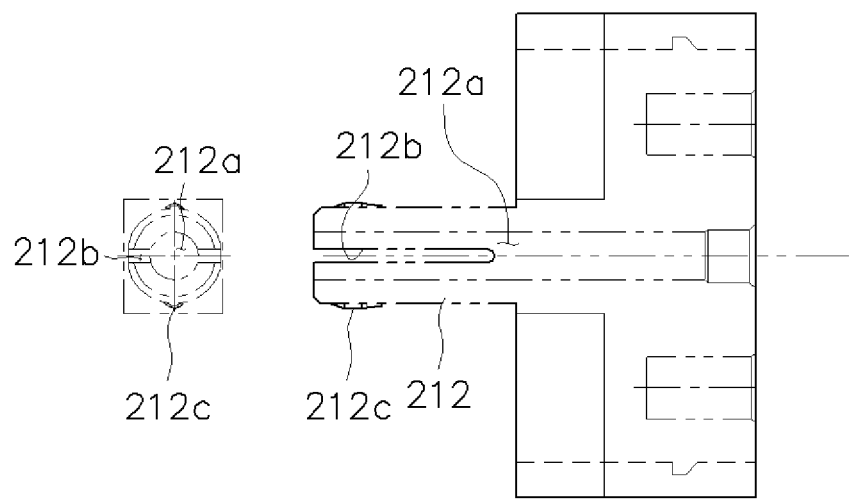
FIG. 21 is a cross-sectional view taken along line E-E of FIG. 18.
Figure 22:
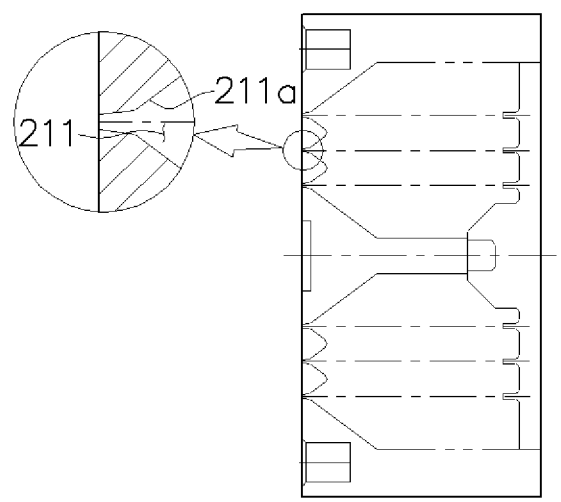
FIG. 22 is a cross-sectional view taken along line F-F of FIG. 18.
Figure 23:
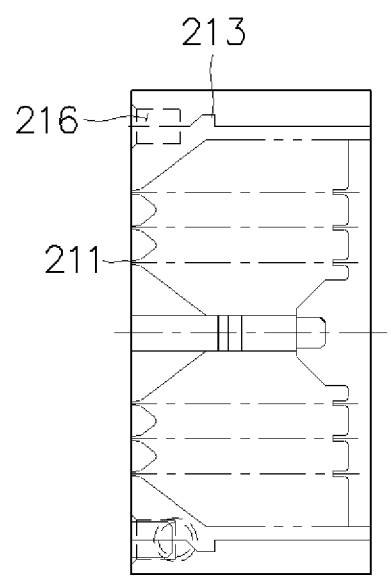
FIG. 23 is a cross-sectional view taken along line G-G of FIG. 18.
Figure 24:
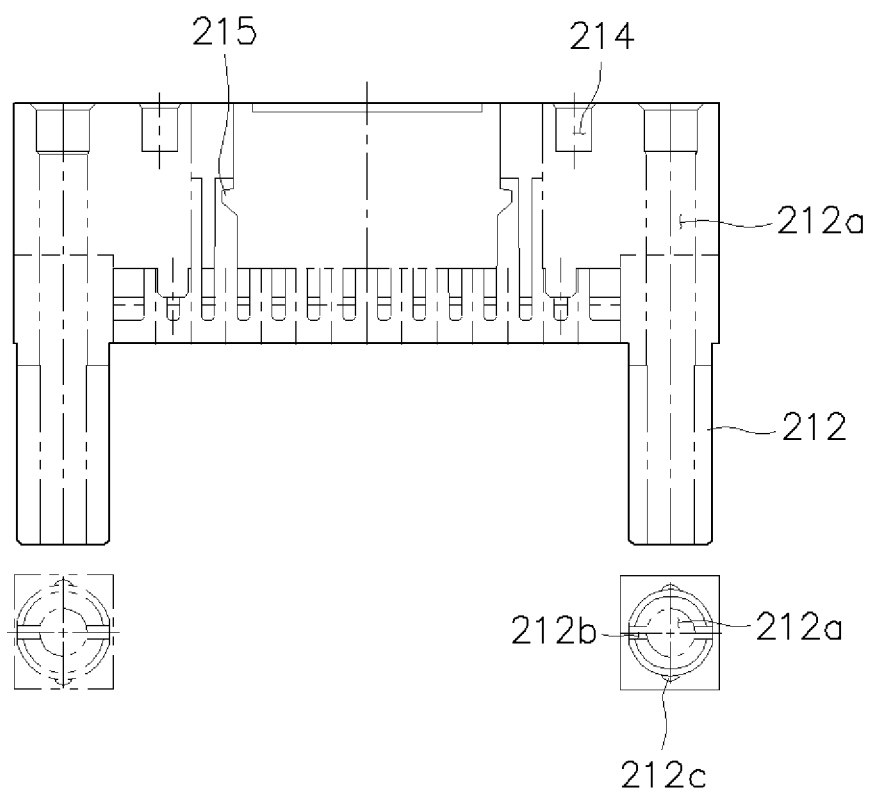
FIG. 24 is a sectional view taken along line H-H of FIG. 18.

FIG. 18 is a top plan view of a main body part of the socket device according to the first embodiment of the present disclosure; FIG. 19 is a rear view of the main body part of the socket device according to the first embodiment of the present disclosure; FIG. 20 is a sectional view taken along line D-D of FIG. 18; FIG. 21 is a cross-sectional view taken along line E-E of FIG. 18; FIG. 22 is a cross-sectional view taken along line F-F of FIG. 18; FIG. 23 is a cross-sectional view taken along line G-G of FIG. 18; and FIG. 24 is a sectional view taken along line H-H of FIG. 18.

Referring to FIGS. 18 to 24, the main body part 210 of the embodiment has a rectangular-shaped planar structure having a horizontal top surface and has a plurality of first receiving holes 211 formed through a center thereof, wherein the upper tip part of the contact is located to be inserted through each of the first receiving holes 211.

Particularly, as illustrated in FIG. 22, in the main body part 210, a guide surface 211a allowing the first receiving hole 211 to be defined has an inclined surface gradually getting narrower toward an opening part of the upper end of main body part 210, so the contact (see FIG. 9) of the embodiment is limited in an upward movement thereof after being received in the main body part 210 and can be compressed and moved only downward. The guide surface 211a of the first receiving hole 211 may be variously modified in an angle or shape such that the contact performs only the downward compressed movement according to the shape of the contact applied.

The main body part 210 includes the mounting part 212 having a column shape formed by protruding and extending from the lower end thereof. The mounting part 212 includes the through hole 212a formed therethrough along a longitudinal direction thereof; the groove 212b formed by cutting up to a predetermined height from the lower end part thereof; and a plurality of removal prevention protrusions 212c formed on the outer circumferential surface thereof by protruding therefrom. The rivet pin is press-fitted into the through hole 212a such that the removal prevention protrusion 212c is prevented from being deformed and contracted inward.

The main body part 210 has a plurality of first holding steps 213 provided on the edge thereof. The first holding steps 213 are assembled with hook arms of the floating plate, and guide the vertical movement of the floating plate at a side upper than the main body part 210.

The main body part 210 has a plurality of first receiving grooves 214 formed on an upper surface thereof, and the floating springs are seated in the first receiving grooves 214 and elastically support the floating plate.

The main body part 210 has a plurality of second holding steps 215 formed by protruding at the inside of space defined in a lower end of the main body part 210. Each of the second holding steps 215 is assembled with a fixed arm provided on the lower plate by a snap-in method so the main body part 210 is assembled with the lower plate. Reference numeral 216 refers to a guide groove, and the guide groove guides the vertical movement of the floating plate in the process of the vertical movement of the floating plate by inserting the guide protrusion of the floating plate to the guide groove.

Figure 25:
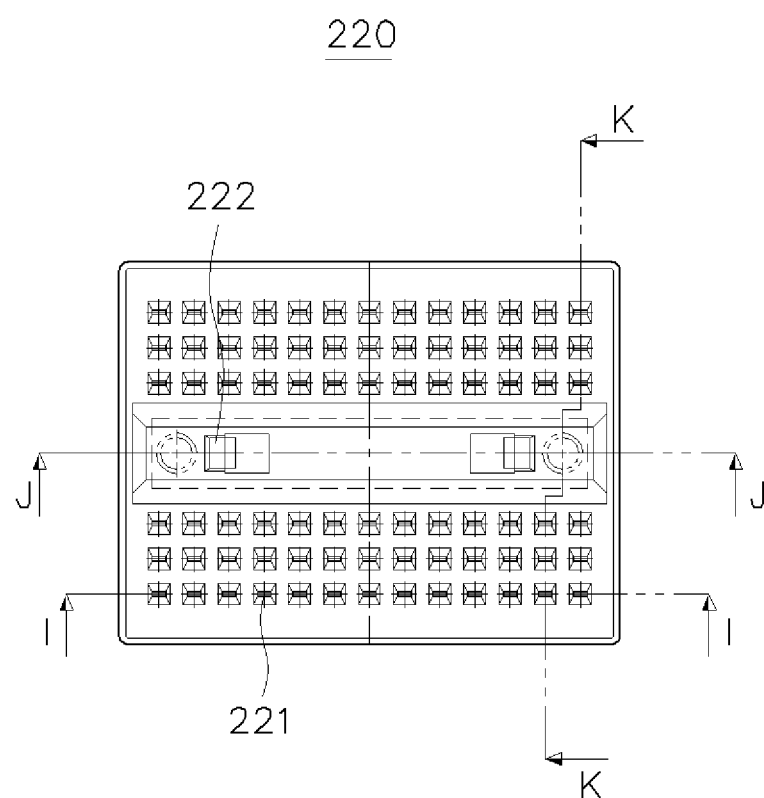
FIG. 25 is a top plan view of a lower plate of the socket device according to the first embodiment of the present disclosure.
Figure 26A:
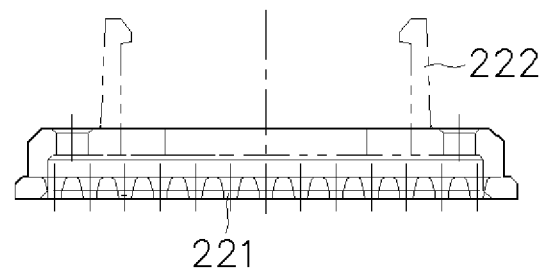
FIGS. 26A and 26B are sectional views taken along lines I-I and J-J of FIG. 25, respectively.
Figure 26B:
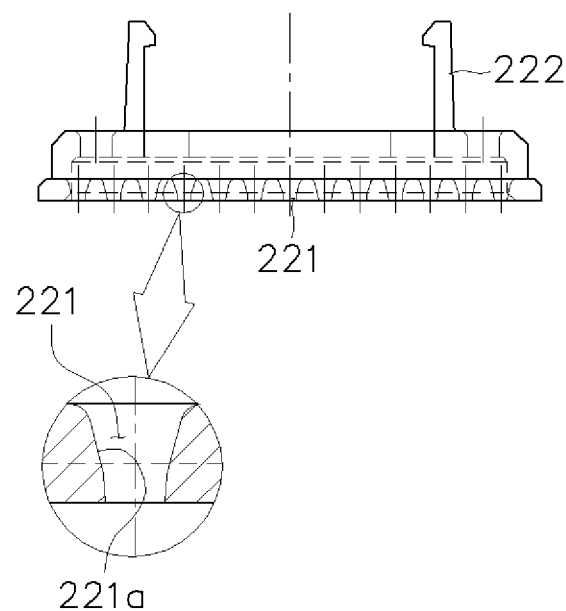
Figure 27A:
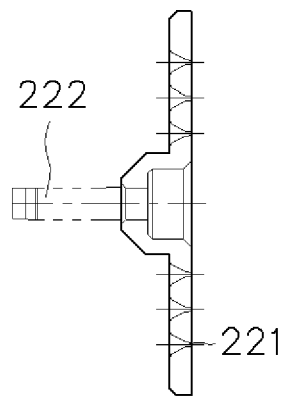
FIGS. 27A and 27B are a cross-sectional view taken along line K-K of FIG. 25 and a rear view thereof, respectively.
Figure 27B:
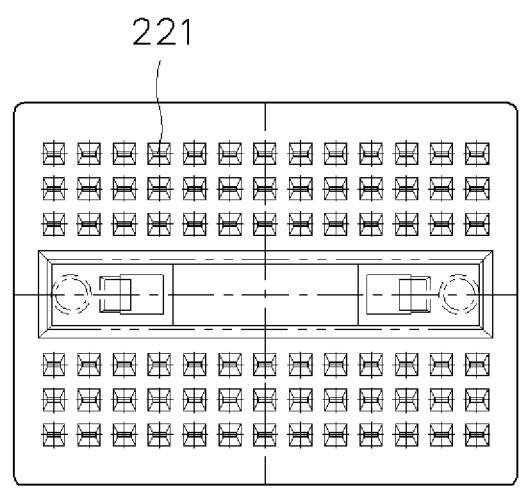

FIG. 25 is a top plan view of the lower plate of the socket device according to the first embodiment of the present disclosure; FIGS. 26A and 26B are sectional views taken along line I-I and line J-J of FIG. 25, respectively; and FIGS. 27A and 27B are a cross-sectional view and a rear view taken along line K-K of FIG. 25, respectively.

Referring to FIGS. 25, 26A, 26B, 27A, and 27B, the lower plate 220 is assembled with the lower end of the main body part, and has the plurality of second receiving holes 221 formed at positions corresponding to the first receiving holes of the main body part, and the lower tip part of the contact is held in each of the second receiving holes 221 with the lower tip part of the contact protruding downward from the lower plate 220.

Particularly, as illustrated in FIG. 26B, in the lower plate 220, a guide surface 221a allowing the second receiving hole 221 to be defined has an inclined surface gradually getting narrower toward an opening part of the lower end of the lower plate 220. Accordingly, the lower tip part of the contact (see FIG. 9) of the embodiment is held in the second receiving hole 221 with the lower tip part protruding by a predetermined length downward from the lower end of the lower plate 220 and is limited in a downward movement thereof. Meanwhile, the guide surface 221a of the second receiving hole 221 may be variously modified in an angle or shape according to the shape of the contact applied.

Figure 28:
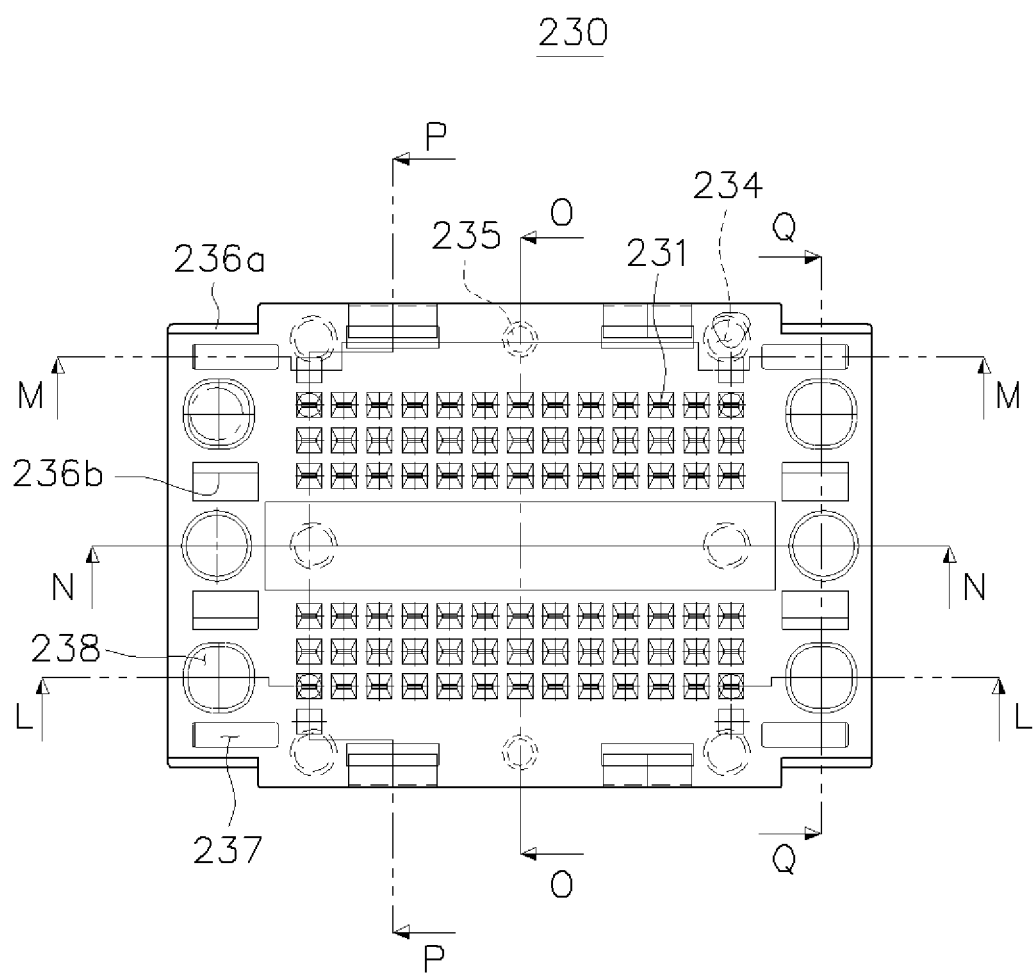
FIG. 28 is a top plan view of a floating plate of the socket device according to the first embodiment of the present disclosure.
Figure 29:
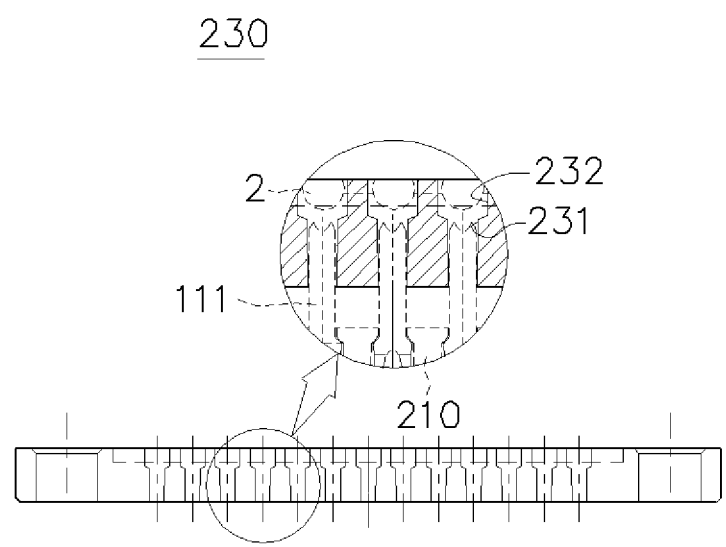
FIG. 29 is a sectional view taken along line L-L of FIG. 28.
Figure 30:
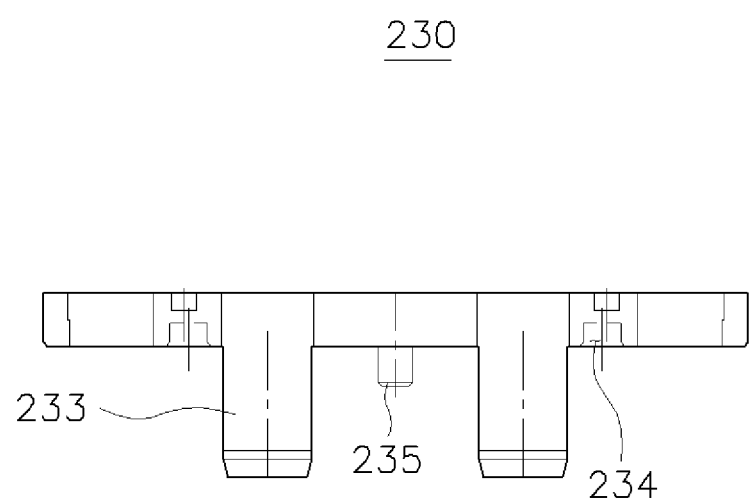
FIG. 30 is a sectional view taken along line M-M of FIG. 28.
Figure 31:
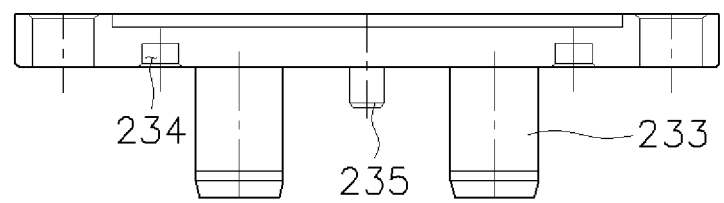
FIG. 31 is a sectional view taken along line N-N of FIG. 28.
Figure 32:
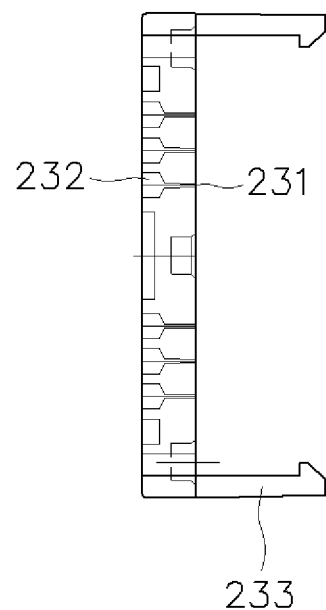
FIG. 32 is a cross-sectional view taken along line O-O of FIG. 28.
Figure 33:
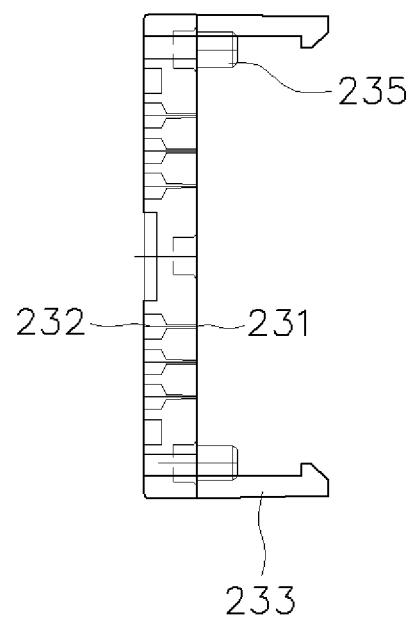
FIG. 33 is a cross-sectional view taken along line P-P of FIG. 28.
Figure 34:
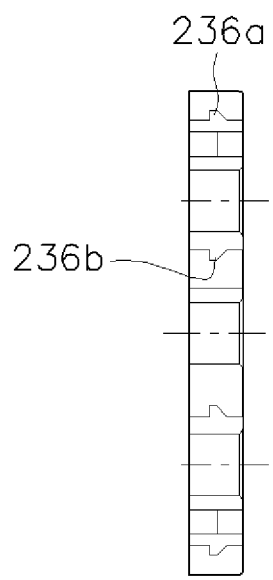
FIG. 34 is a cross-sectional view taken along line Q-Q of FIG. 28.

FIG. 28 is a top plan view of the floating plate of the socket device according to the first embodiment of the present disclosure; FIG. 29 is a sectional view taken along line L-L of FIG. 28; FIG. 30 is a sectional view taken along line M-M of FIG. 28; FIG. 31 is a sectional view taken along line N-N of FIG. 28; FIG. 32 is a cross-sectional view taken along line O-O of FIG. 28; FIG. 33 is a cross-sectional view taken along line P-P of FIG. 28; and FIG. 34 is a cross-sectional view taken along line Q-Q of FIG. 28.

Referring to FIGS. 28 to 34, the floating plate 230 of the embodiment has the contact hole 231 formed therein at a position corresponding to the first receiving hole of the main body part such that an upper terminal part 111 is located in the contact hole 231, and is located to be spaced apart from the upper end of the main body part. As described above, such a floating plate 230 is spaced apart from the main body part 210 by a predetermined interval, and is elastically supported by the floating springs.

Preferably, the floating plate 230 includes the ball terminal receiving hole 232 formed to expand upward from the contact hole 231 such that the ball terminal 2 of the semiconductor IC is received in the ball terminal receiving hole 232.

The floating plate 230 includes the plurality of hook arms 233 extending to the lower end thereof from the edge thereof. The hook arms 233 are assembled with the first holding steps 213 (see FIG. 18) of the main body part and guide the vertical movement of the floating plate.

A plurality of second receiving grooves 234 are formed in the lower surface of the floating plate 230 such that the second receiving grooves 234 are located at positions corresponding to the first receiving grooves 214 of the main body part, and the floating spring elastically supporting the main body part and the floating plate is seated in each of the second receiving grooves 234. Reference numeral 235 is the guide protrusion fitted to the guide groove 216 (see FIG. 23) of the main body part, and guides the vertical movement of the floating plate in the process of the vertical movement of the floating plate.

As described above, the floating plate 230 has the IC holding part assembled therewith and has a plurality of guide steps 236a and 236b formed therein, the guide steps guiding the sliding of the IC holding part within the range of a predetermined distance. In the embodiment, the guide steps 236a and 236b include a first guide step 236a formed at the edge of the floating plate 230 and a second guide step 236b provided at a side inner than the first guide step 236a. Four guide steps are illustrated to be provided for the IC holding part assembled with the left side of the floating plate 230 relative to FIG. 28, but the positions or number of the guide steps may be increased or decreased.

The floating plate 230 includes a holding spring assembly parts 237 with which the floating springs elastically supporting the IC holding part in a horizontal direction are assembled.

The floating plate 230 has a plurality of second manipulation holes 238 formed vertically therethrough, and each of the second manipulation holes 238 is a hole for guiding the IC loading/unloading device (not shown) which is an auxiliary device for the loading/unloading of the IC.

Figure 35:
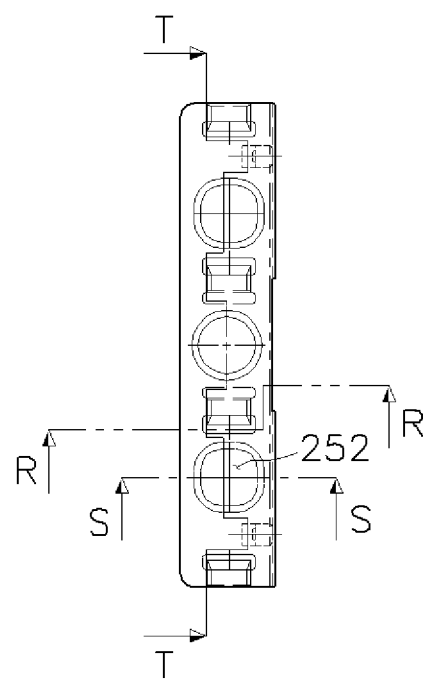
FIG. 35 is a top plan view of an IC holding part of the socket device according to the first embodiment of the present disclosure.
Figure 36A:
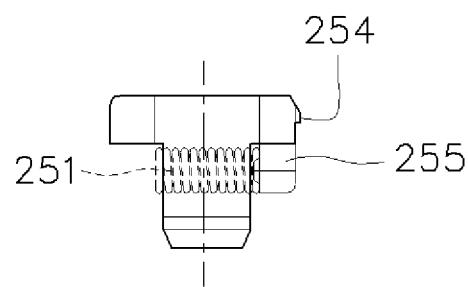
FIGS. 36A and 36B are cross-sectional views taken along lines R-R and S-S of FIG. 35, respectively.
Figure 36B:
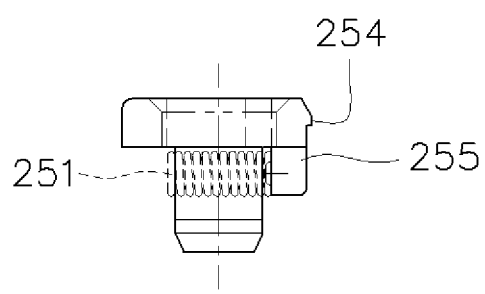
Figure 37A:
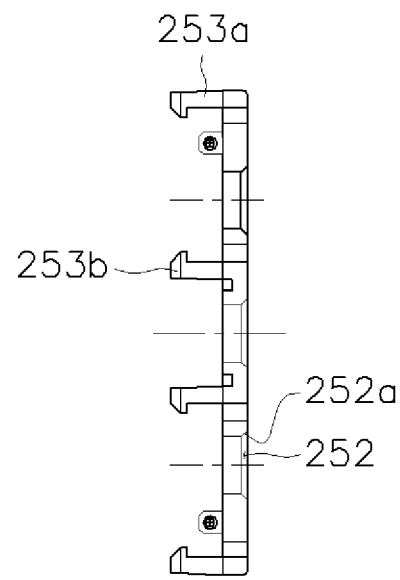
FIGS. 37A and 37B are a sectional view taken along line T-T of FIG. 35 and a side view thereof, respectively.
Figure 37B:
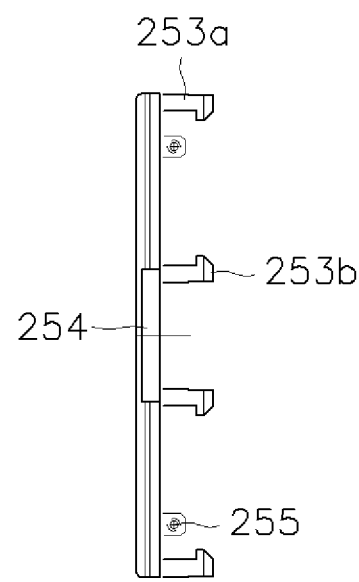

FIG. 35 is a top plan view of the IC holding part of the socket device according to the first embodiment of the present disclosure; FIGS. 36A and 36B are cross-sectional views taken along lines R-R and S-S of FIG. 35, respectively; and FIGS. 37A and 37B are a sectional view taken along line T-T of FIG. 35 and a side view thereof, respectively.

Referring to FIGS. 35, 36A, 36B, 37A, and 37B, the IC holding part 250 of the embodiment is provided on each of the opposite ends of the upper side of the floating plate 230 and is configured to stably hold the loaded IC, and includes a plurality of guide arms 253a and 253b assembled with each of the guide steps 236a and 236b (see FIG. 34) of the floating plate and guiding the horizontal movement of the IC holding part 250.

The IC holding part 250 has a holding surface 254 formed at an end thereof such that the holding surface is in contact with the loaded IC, and includes a holding spring fixing part 255 to which an end of the holding spring 251 is fixed.

Reference numeral 252 refers to the first manipulation hole vertically formed through the IC holding part 250, and the second manipulation hole guides the IC loading/unloading device 270 (see FIGS. 38 to 40) which is an auxiliary device for the loading/unloading of the IC. Preferably, a guide inclining surface 252a is formed by expanding an upper open end of the first manipulation hole 252, and guides insertion directions of manipulation pins 273 provided on the IC loading/unloading device.

Figure 38:
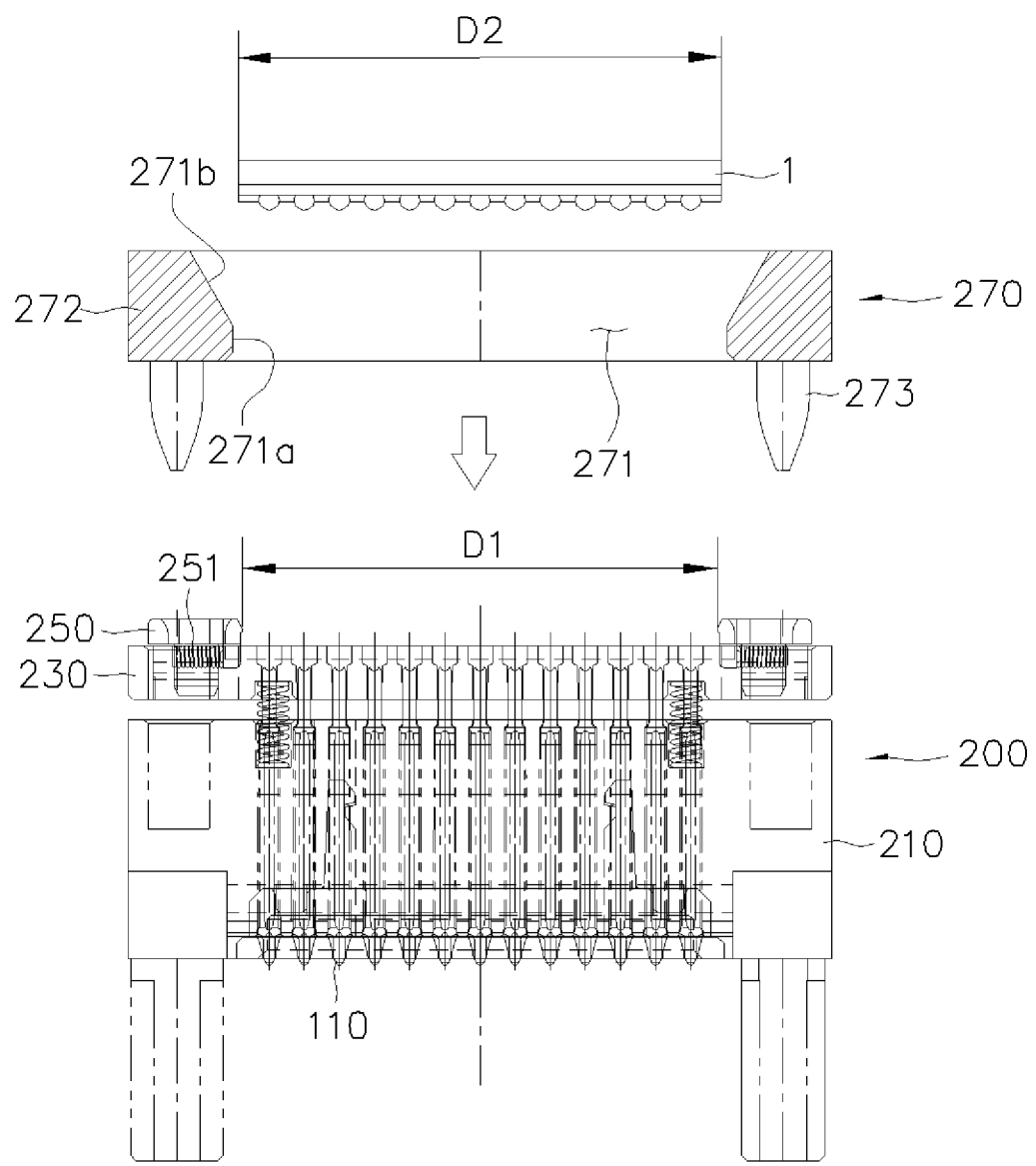
FIGS. 38 to 40 are views illustrating the operation of the socket device according to the first embodiment of the present disclosure.
Figure 39:
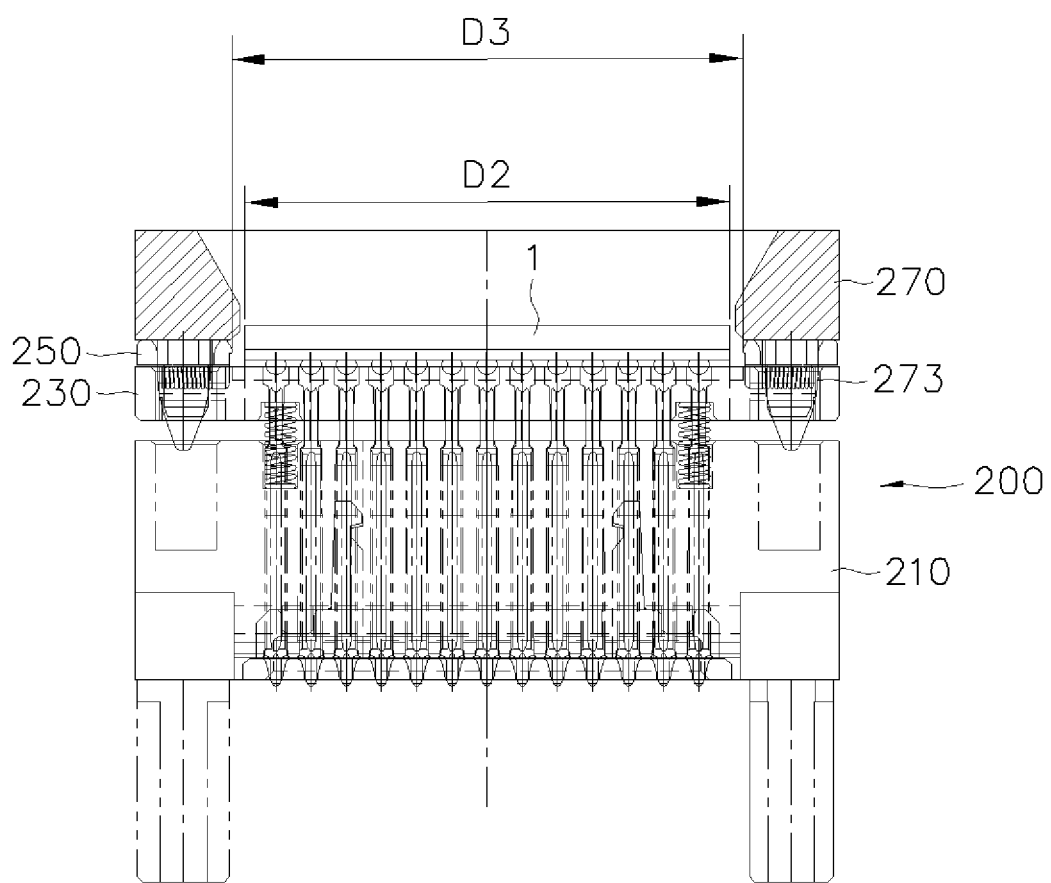
Figure 40:
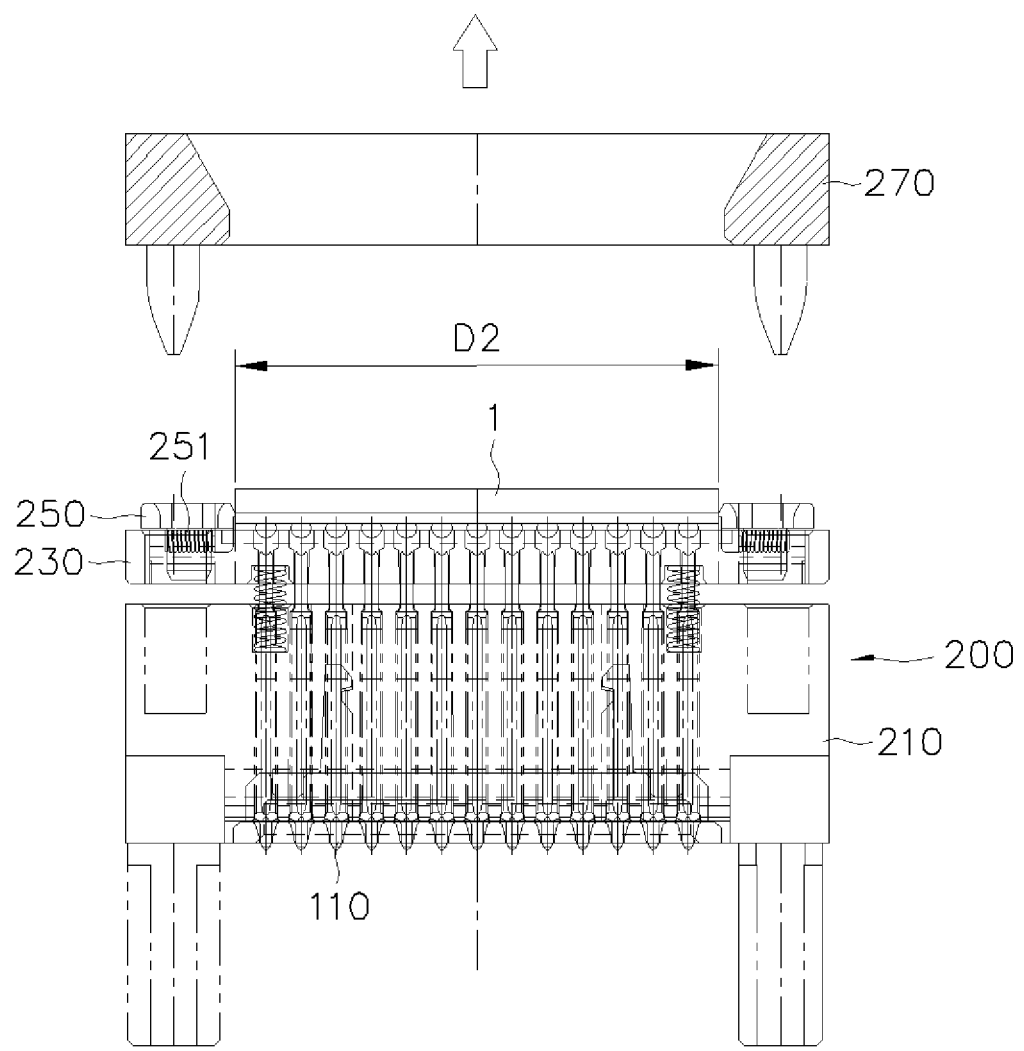

FIGS. 38 to 40 are views illustrating the operation of the socket device according to the first embodiment of the present disclosure.

Referring to FIG. 38, for the loading of the IC 1, the IC loading/unloading device 270 which is a separate auxiliary device may be used. The IC loading/unloading device 270 includes a body part 272 having an opening part 271 formed therein such that the IC is loaded in the opening part 271 and the plurality of manipulation pins 273 formed by protruding from the lower end of the body part 272.

The body part 272 includes a guide side-wall 271a defining the lower end of the opening part 271 and a guide inclining surface 271b famed by extending to incline from the guide side-wall 271a.

In the socket device 200, an interval D1 between the two IC holding parts 250 provided on the floating plate 230 is maintained to be smaller than the width D2 of the loaded IC 1 (D1<D2).

Referring to FIG. 39, when the IC loading/unloading device 270 is fitted to the upper part of the socket device 200, the manipulation pins 273 are inserted into the manipulation holes 252 and 238 of the IC holding part 250 and the floating plate 230 to increase the interval D1 between the two IC holding parts 250, and the IC 1 is seated on the floating plate 230.

As illustrated in FIG. 40, when the IC loading/unloading device 270 is removed in a state in which the IC 1 is seated on the floating plate 230, the IC holding part 250 is in close contact with the side surface of the IC 1 by the holding spring 251 and holds the IC 1. Accordingly, the IC 1 seated on the socket device 200 is pressed by a pusher (not shown) and the terminal of the IC 1 is in contact with the upper tip part of the contact 110, so the test of the IC can be performed. Meanwhile, during the unloading of the IC, the IC loading/unloading device 270 is assembled with the socket device 200 again, and increases the interval between the IC holding parts 250 holding the IC 1, so the unloading of the IC 1 is performed.

Figure 41:
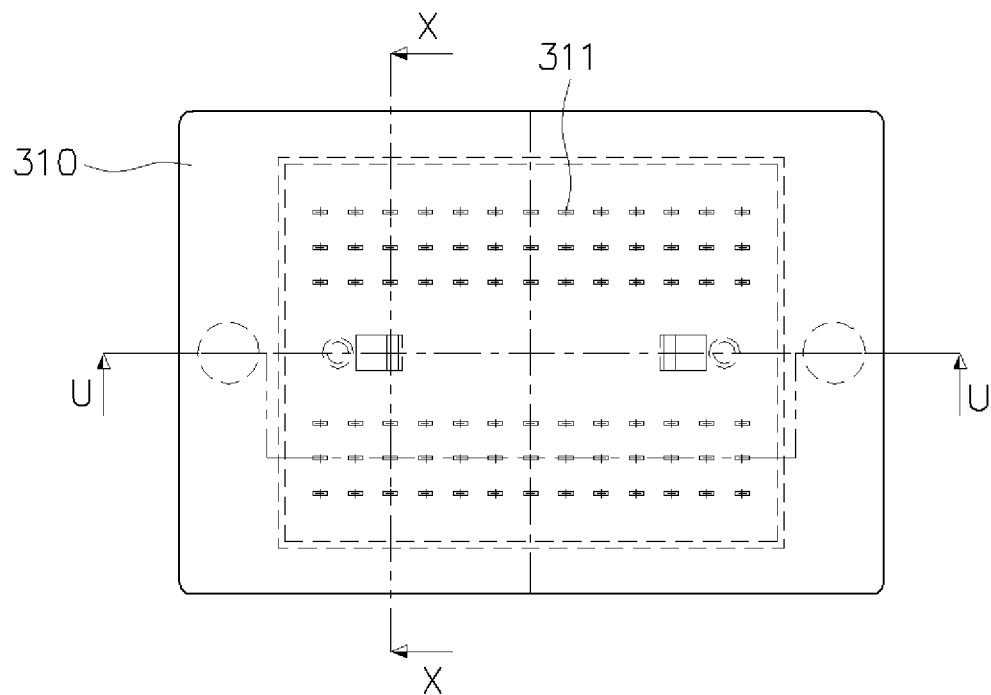
FIG. 41 is a top plan view of a socket device according to the second embodiment of the present disclosure.
Figure 42:
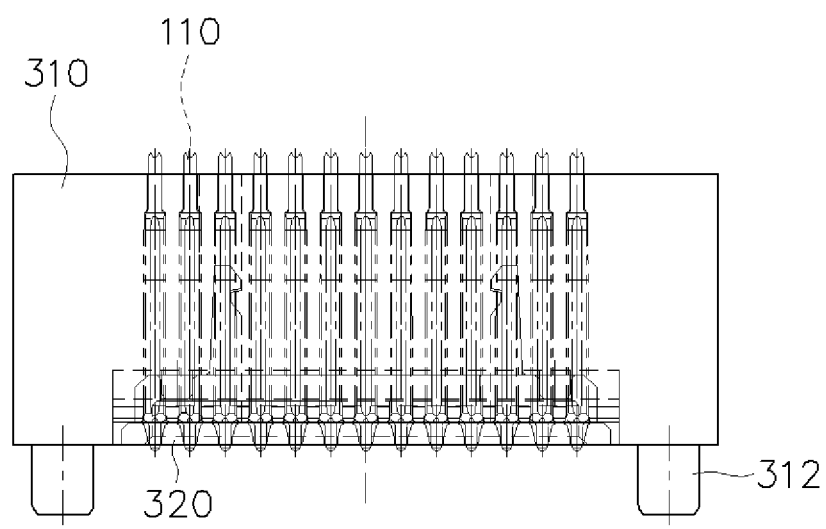
FIG. 42 is a sectional view taken along line U-U of FIG. 41.

FIG. 41 is a top plan view of a socket device according to the second embodiment of the present disclosure; FIG. 42 is a sectional view taken along line U-U of FIG. 41; and FIG. 43 is a cross-sectional view taken along line X-X of FIG. 41.

Figure 43:
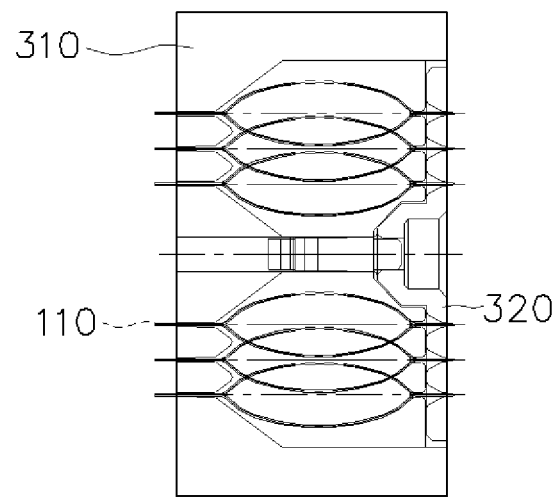
FIG. 43 is a cross-sectional view taken along line X-X of FIG. 41.

Referring to FIGS. 41 to 43, the socket device 300 of the second embodiment as a modified embodiment of the socket device of the first embodiment includes: a main body part 310; a lower plate 320; and a plurality of contacts 110 provided in the main body part 310 and the lower plate 320.

The main body part 310 and the lower plate 320 of the socket device according to the second embodiment is the same as the main body part 210 and the lower plate 220 of the socket device according to the first embodiment. However, the mounting parts 212 (see FIG. 7) of the main body part 210 may be replaced with a plurality of guide pins 312 such that the main body part 310 and the lower plate 320 are mounted to the precise positions of the PCB, or may be excluded.

In the socket device 300 of the second embodiment having such a configuration, the upper ends of the contacts 110 are in contact with terminals of the IC (or terminals of a PCB), and the lower ends of the contacts 110 are in contact with terminals of another PCB, so the test of the IC can be performed. Alternatively, the socket device 300 may be used as a contactor electrically connecting the PCBs to each other.

Such a contactor may include contacts variously arranged to have various pitches, thereby realizing stable electrical resistance characteristics and a high cost-reduction effect in mass production.

Figure 44:
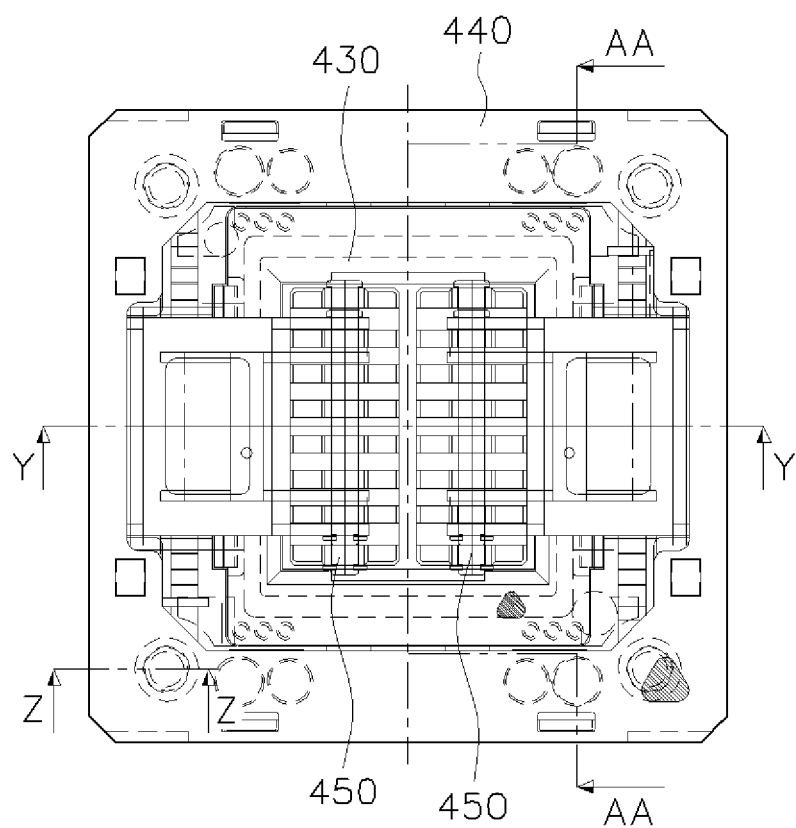
FIG. 44 is a top plan view of a socket device according to the third embodiment of the present disclosure.
Figure 45:
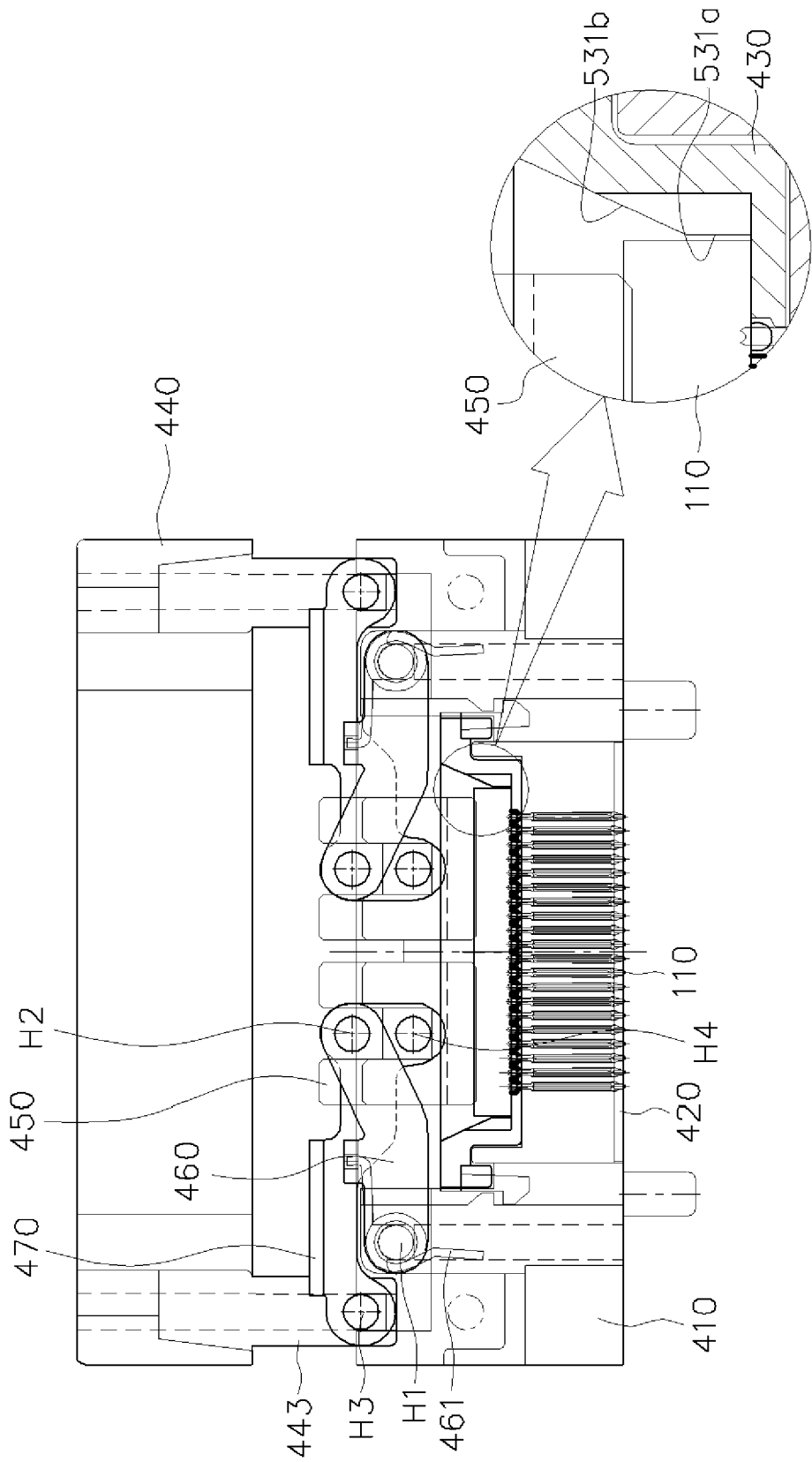
FIG. 45 is a sectional view taken along line Y-Y of FIG. 44.
Figure 46A:
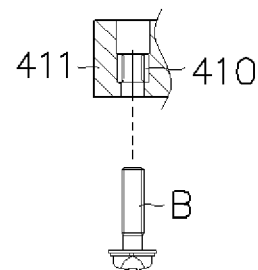
FIGS. 46A and 46B are sectional views taken along line Z-Z and line AA-AA of FIG. 44, respectively.
Figure 46B:
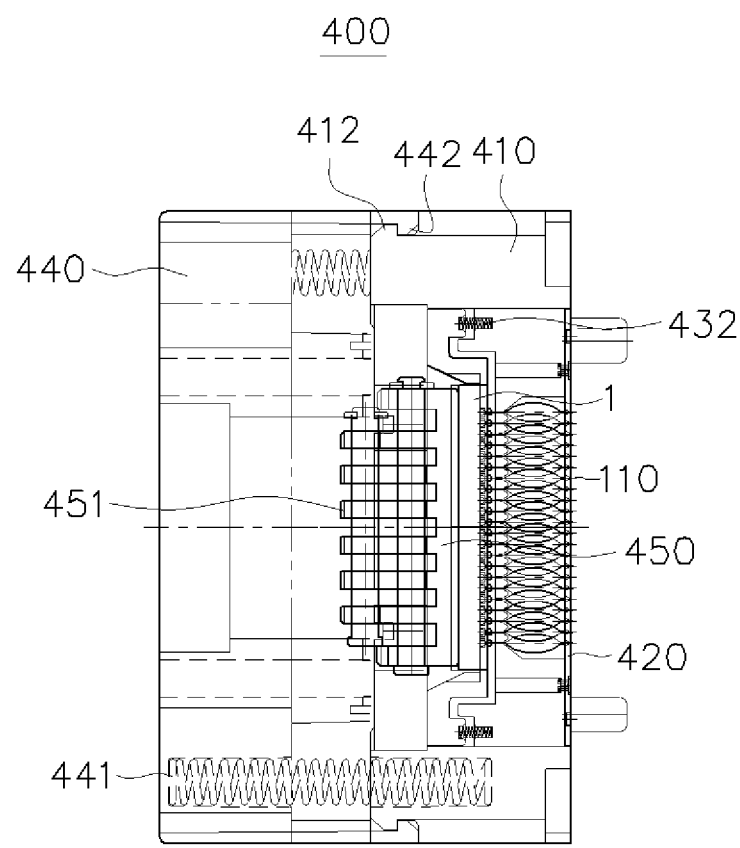
Figure 47:
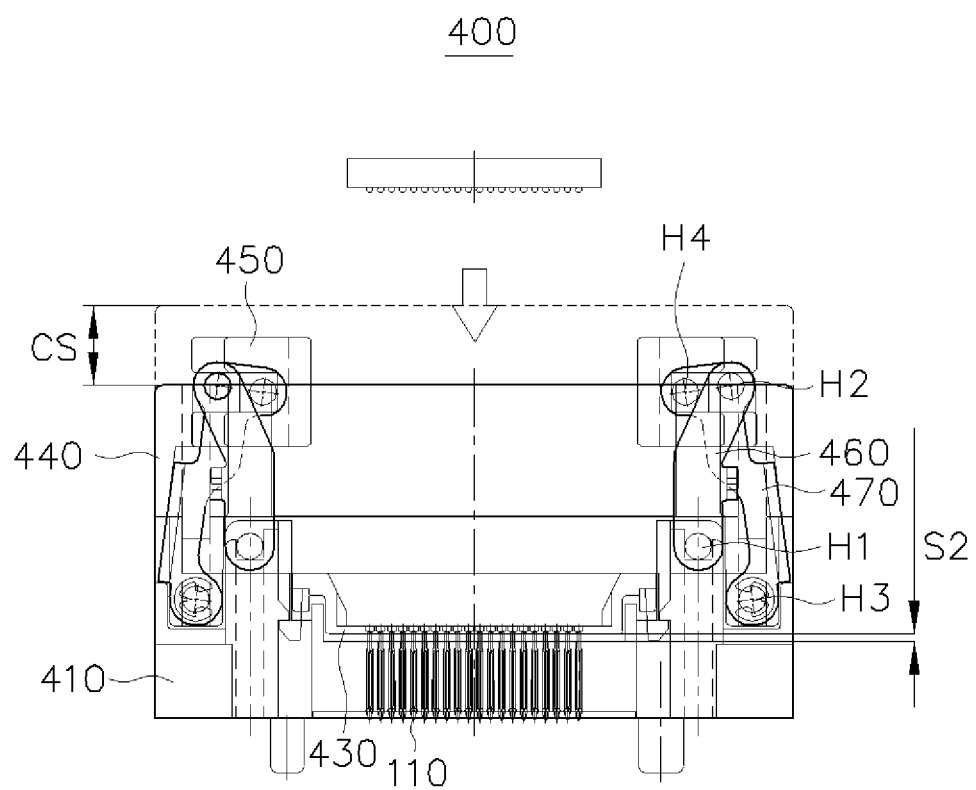
FIG. 47 is a sectional view illustrating the operation of the socket device according to the third embodiment of the present disclosure.

FIG. 44 is a top plan view of the socket device according to the third embodiment of the present disclosure; FIG. 45 is a sectional view taken along line Y-Y of FIG. 44; FIGS. 46A and 46B are sectional views taken along line Z-Z and line AA-AA of FIG. 44, respectively; and FIG. 47 is a sectional view illustrating the operation of the socket device according to the third embodiment of the present disclosure.

Referring to FIGS. 44, 45, 46A, and 46B, a socket device 400 of the third embodiment includes a main body part 410, a lower plate 420, and a floating plate 430 which are substantially the same components as the socket device of the first embodiment (see FIG. 6). Particularly, the socket device 400 includes a cover part 440 elastically supported on the upper part of the main body part 410 and capable of moving vertically, and a pair of open top type pressing means being horizontally symmetrical to each other relative to the main body part 410 and pressing the IC 1 sitting on the floating plate 430 by operating in cooperation with the vertical movement of the cover part 440 such that the terminals of the IC 1 and the contacts 110 are electrically connected to each other.

The main body part 410 may include insert nuts 411 on a lower end surface thereof to mount the socket device to the PCB, and is coupled to the PCB by using the insert nuts 411 and screws B.

The cover part 440 is spaced apart from the upper part of the main body part 410 by a coil spring 441 and is elastically supported thereby. The cover part 440 is provided with a stopper arm 442 extending from an edge of a lower end thereof, wherein the stopper arm 442 is limited in upward movement thereof by a stopper protrusion 412 formed by protruding from the main body part 410. When a manipulation force is not applied to the cover part 440, the cover part 440 is located to be sufficiently spaced apart from the upper part of the main body part 410 by the coil spring 441, and the floating plate 430 is located to be spaced apart by a predetermined distance S2 from the main body part 410 by floating springs 432. For reference, FIG. 45 illustrates the state of the IC 1 pressed by a pusher 450 when the cover part 440 is located at the upper end of the socket device and the pusher 450 is moved downward. FIG. 47 illustrates a state in which the cover part 440 is pressed by a cover stroke (CS) by the manipulation force and the pusher 450 is open so that the loading/unloading of the IC is performed.

The cover part 440 includes guide legs 443 extending vertically from the lower end of the cover part 440, wherein each of the guide legs 443 is inserted to the main body part 410 and guides the vertical movement of the cover part 440.

Each of the open top type pressing means includes: the pusher 450 in surface contact with and pressing the upper surface of the IC 1 sitting on the floating plate; a link 460 assembled rotatably with the main body part 410 by a first hinge shaft H1 at a first end thereof and assembled rotatably with the pusher 450 by a second hinge shaft H2 at a second end thereof; and a latch 470 assembled rotatably with the cover part 440 by a third hinge shaft H3 at a first end thereof and configured to be rotated by the second hinge shaft H2 commonly used at a second end thereof, the latch being assembled rotatably with the pusher 450 by a fourth hinge shaft H4 spaced apart from the second hinge shaft H2.

The pusher 450 is intended to directly press the IC 1 by being in surface contact with the upper surface of the IC 1. Preferably, the pusher 450 includes a heat discharge part discharging heat. In the embodiment, the heat discharge part is illustrated to have heat sink fins 451 formed to be integrated with the upper surface of the pusher 450. In other embodiments, a separate heat sink may be assembled with the upper part of the pusher 450. Such a heat discharge part discharges heat produced by the IC during the test of the IC.

The link 460 is assembled rotatably with the main body part 410 by the first hinge shaft H1 at a first end thereof, and assembled rotatably with the latch 470 by the second hinge shaft H2 at a second end thereof. Preferably, the first hinge shaft H1 of the link 460 is elastically supported by a torsion spring 461, and can elastically support the link 460 in an opening or closing direction of the link 460.

The latch 470 has three hinge shafts H2, H3, and H4. The latch 470 is assembled rotatably with the guide leg 443 of the cover part 440 by the third hinge shaft H3 at a first end thereof; has the second hinge shaft H2 commonly used at a second end thereof; and has the fourth hinge shaft H4 spaced apart from the second hinge shaft H2 and allowing the latch to be hinged directly to the pusher 450. Preferably, the fourth hinge shaft H4 is located at a position lower than the second hinge shaft H2 and allows the latch to be hinged to the pusher 450.

Each hinge shaft of the link 460 and the latch 470 may be assembled freely rotatably with the guide leg 443, the main body part 410, and the pusher 450 by a hinge pin and a snap ring.

Accordingly, the first hinge shaft H1 acts as a hinge shaft fixed to the main body part 410; the third hinge shaft H3 acts as a hinge shaft that moves according to the vertical movement of the cover part 440; and the second hinge shaft H2 and the fourth hinge shaft H4 also act as hinge shafts which move the pusher 450 opening and closing to have a predetermined trajectory by operating in cooperation with the vertical position of the third hinge shaft H3.

Even with a small vertical stroke of the cover part 440 (CS), such an open top type pressing means can obtain a sufficient open angle of the pusher to minimize the interference of the IC 1 with the pusher 450 during the loading of the IC 1.

Figure 48:
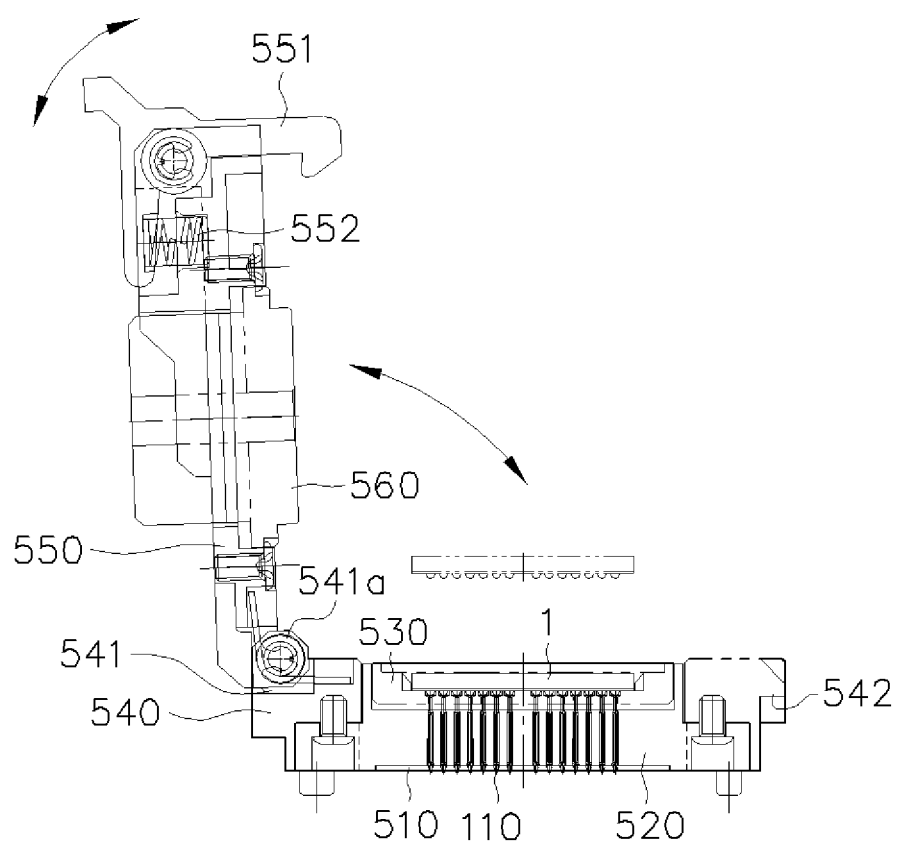
FIG. 48 is a side view of a socket device according to the fourth embodiment of the present disclosure.

FIG. 48 is a side view of a socket device according to the fourth embodiment of the present disclosure.

Referring to FIG. 48, the socket device 500 of the fourth embodiment includes a main body part 510, a lower plate 520, and a floating plate 530 which are substantially the same components as the socket device of the first embodiment (see FIG. 6). Particularly, the socket device 500 includes a clamshell type pressing means pressing the IC 1 sitting on the floating plate 530 such that the terminals of the IC 1 and the contacts 110 are electrically connected to each other.

Such a clamshell type pressing means includes: a base 540 fixed to the main body part 510; a socket lid 550 rotatably assembled with the base 540 and including a latch 551 held in the base 540; and a pusher 560 provided in the socket lid 550 and pressing the upper surface of the IC 1.

The base 540 is fixed to the main body part 510 by covering the surrounding of the main body part 510, and includes a hinge part 541 provided at a first end of the base 540 and a latch holding step 542 provided at a second end thereof.

The socket lid 550 is rotatably assembled with the hinge part 541 by a hinge pin, and includes the latch 551 held in the latch holding step 542. A hinge spring 541a is inserted to the hinge end of the socket lid 550 and thus the socket lid 550 elastically opens and closes relative to the base 540.

Preferably, the latch 551 is hinged rotatably to the socket lid 550, and may include a latch spring 552 elastically supporting the latch 551. The latch spring 552 presses the latch 551 in the locking direction of the socket lid 550 such that the latch 551 is prevented from being easily removed from the latch holding step 542.

The pusher 560 is provided in the socket lid 550, and presses the upper surface of the IC 1, and preferably, includes the heat discharge part for discharging heat.

In the pressing means configured as described above, when the socket lid 550 is closed, the latch 551 is held in the latch holding step 542 and the pusher 560 presses the upper surface of the IC 1, whereby the terminals of the IC 1 and the contacts 110 are electrically connected to each other, and the testing of the IC 1 can be performed.

Meanwhile, in the embodiment, the main body part 510 and the base 540 are separated from each other, but the main body part 510 and the base 540 may be integrated with each other.

Figure 49:
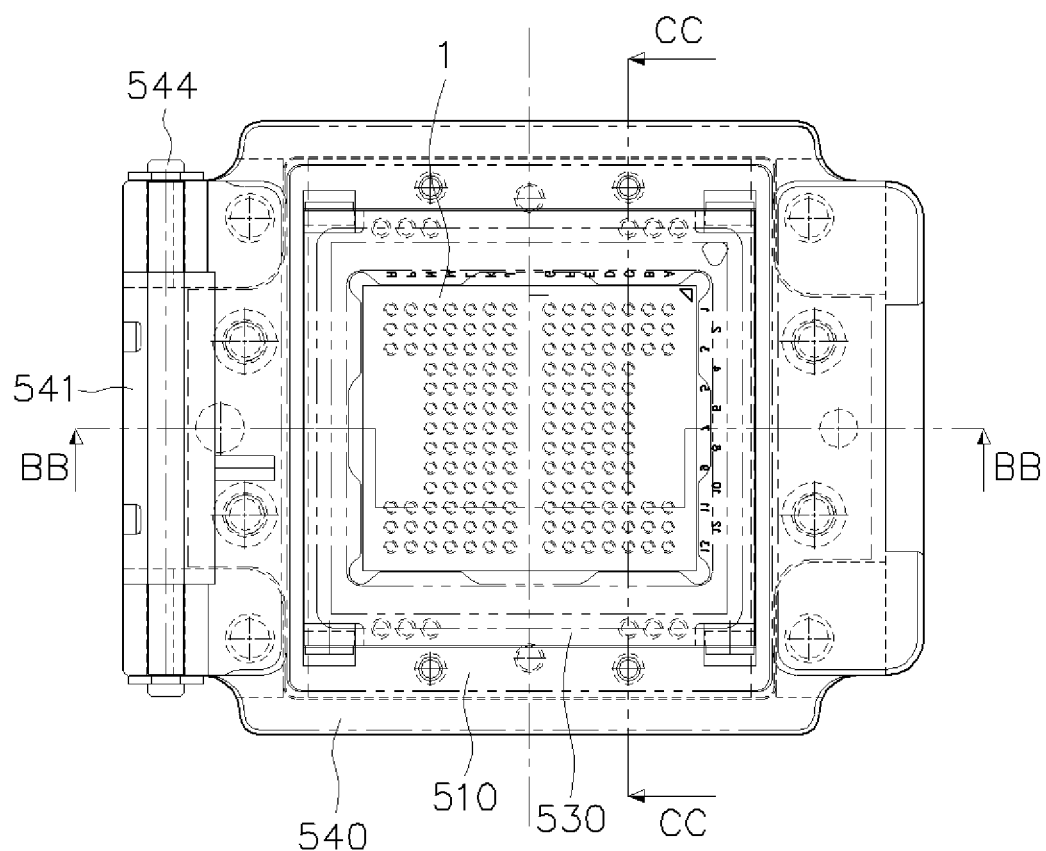
FIG. 49 is top plan view of a body unit of the socket device according to the fourth embodiment of the present disclosure.
Figure 50:
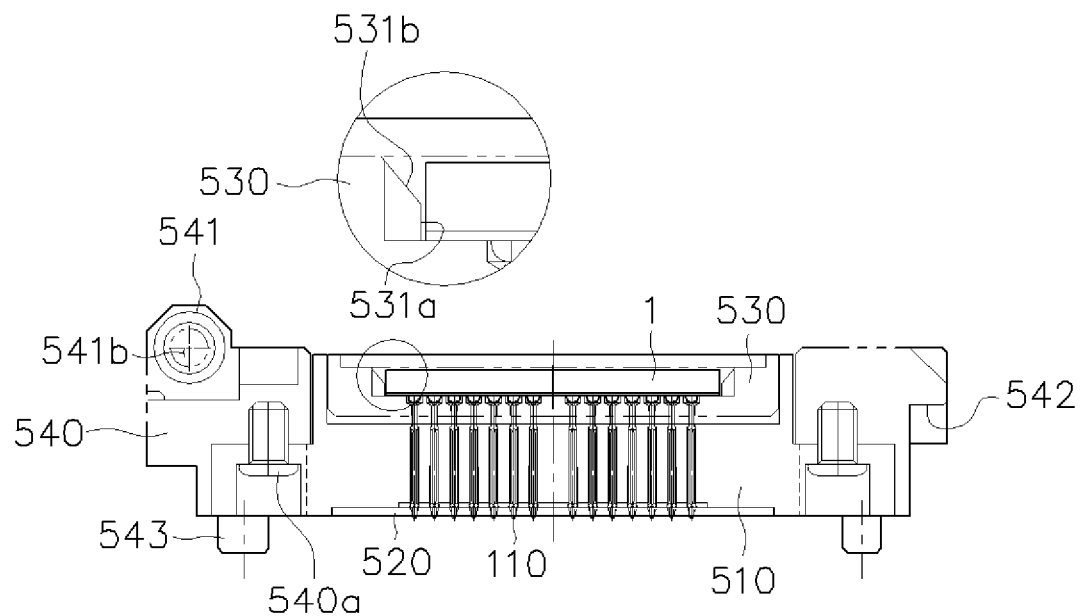
FIG. 50 is a sectional view taken along line BB-BB of FIG. 49.

FIG. 49 is a top plan view of a body unit of the socket device according to the fourth embodiment of the present disclosure; FIG. 50 is a sectional view taken along line BB-BB of FIG. 49; and FIG. 51 is a cross-sectional view taken along line CC-CC of FIG. 49.

Figure 51:
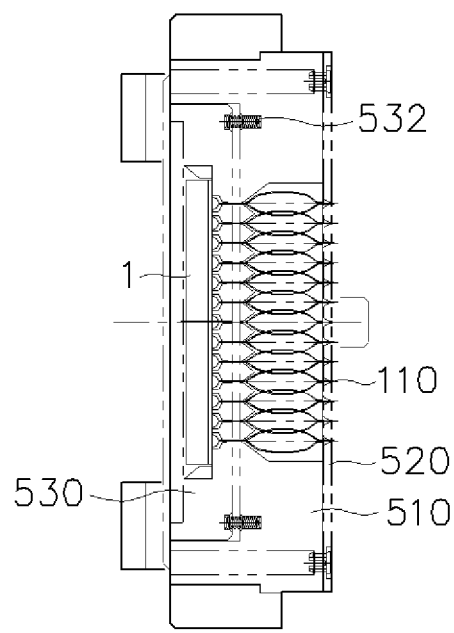
FIG. 51 is a cross-sectional view taken along line CC-CC of FIG. 49.

Referring to FIGS. 49 to 51, as described above, the body unit includes: the main body part 510 fixing the contact 110 thereto; the lower plate 420; and the floating plate 530, which are substantially the same components of the body unit of the first embodiment. Accordingly, descriptions overlapping with the first embodiment will be omitted and differences therefrom will be mainly described.

The base 540 has the hinge part 541 at a first end thereof and the latch holding step 542 at a second end thereof such that the latch is held in the latch holding step. The hinge part 541 has a hinge hole 541b formed therein, and is hinged to the socket lid by a hinge pin 544.

The base 540 may include a plurality of guide pins 543 fixed to the main body part 510 by multiple screws 540a such that the base 540 is mounted to the precise position of the PCB. Each of the guide pins 543 may include an insert nut (not shown) so as to be mounted to the PCB.

Preferably, the floating plate 530 includes an IC seating guide part 531a and 531b on the upper surface thereof, the seating guide part having a guide surface for the seating of the IC.

The IC seating guide part 531a and 531b may include a guide side-wall 531a facing the side surface of the IC 1 and a guide inclining surface 531b formed by inclining upward from the guide side-wall 531a. In FIG. 51, reference numeral 532 is a floating spring.

Figure 52:
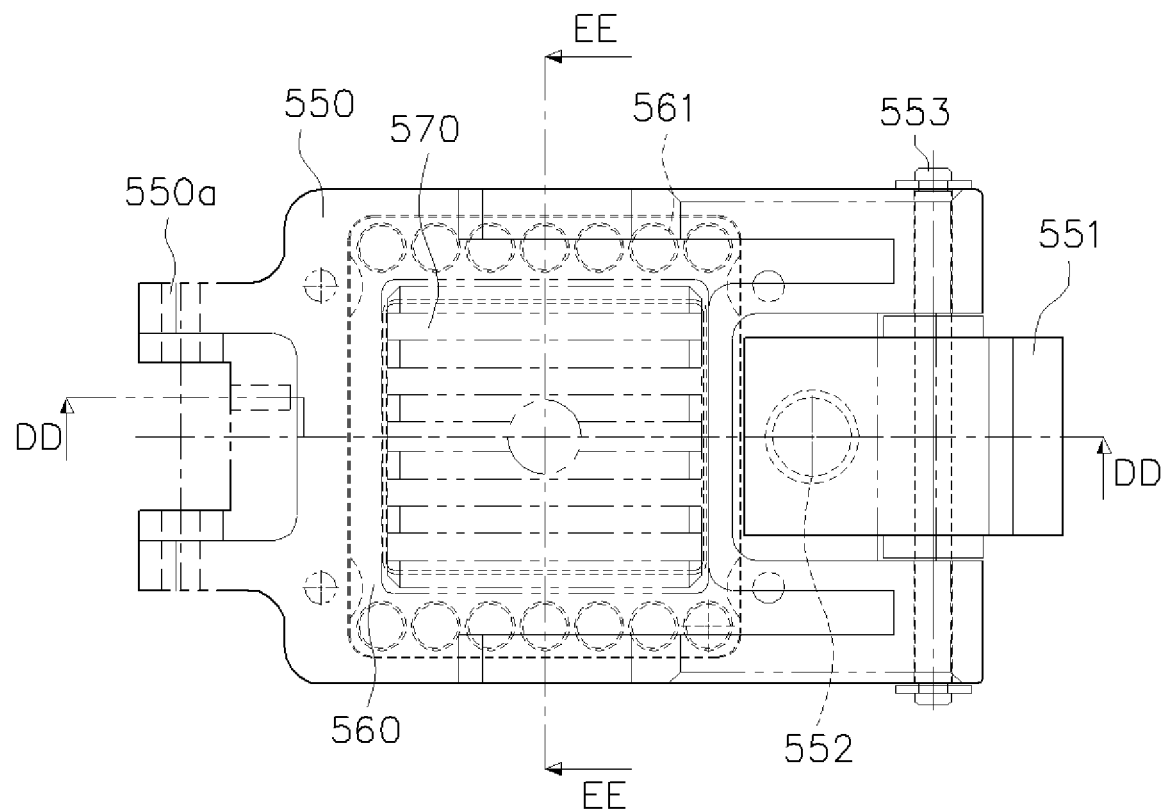
FIG. 52 is a top plan view of a socket lid unit of the socket device according to the fourth embodiment of the present disclosure.
Figure 53:
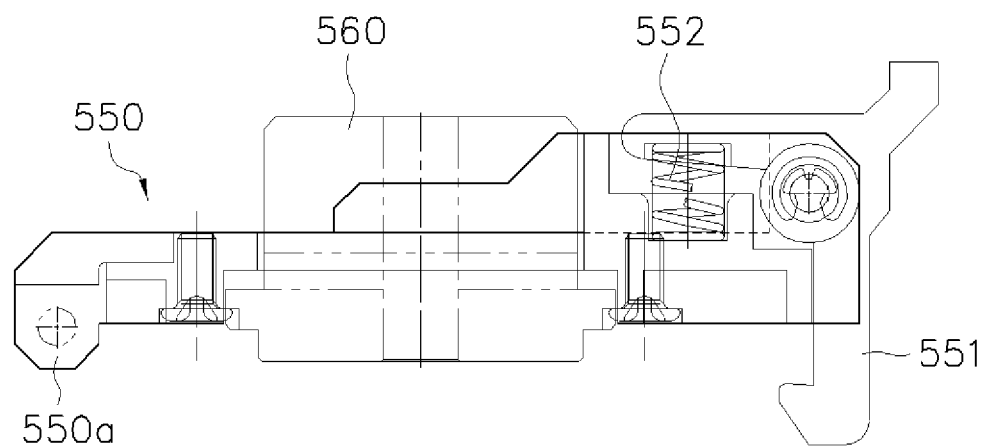
FIG. 53 is a sectional view taken along line DD-DD of FIG. 52.

FIG. 52 is a top plan view of a socket lid unit of the socket device according to the fourth embodiment of the present disclosure; FIG. 53 is a sectional view taken along line DD-DD of FIG. 52; and FIG. 54 is a cross-sectional view taken along line EE-EE of FIG. 52.

Figure 54:
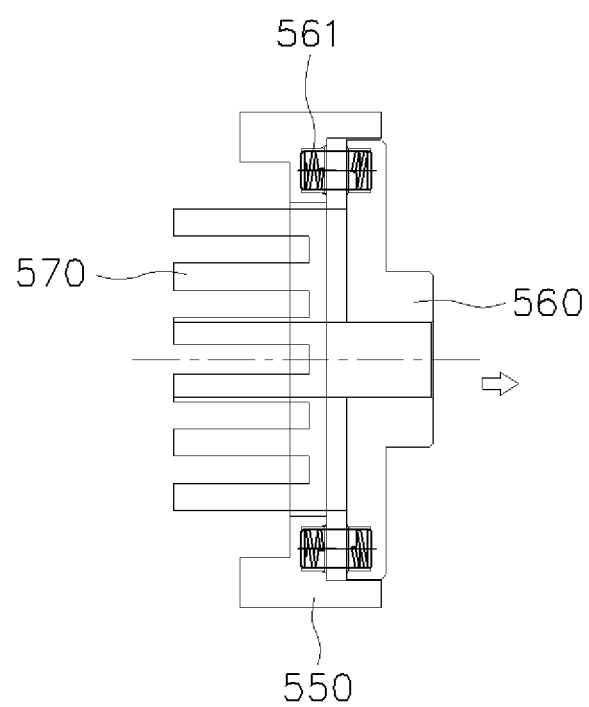
FIG. 54 is a cross-sectional view taken along line EE-EE of FIG. 52.

Referring to FIGS. 52 to 54, the socket lid unit includes: a hinge arm 550a hinged to the base; the socket lid 550 having the latch 551 held in the latch holding step of the base; and the pusher 560 provided in the socket lid 550 and pressing the upper surface of the IC.

The socket lid 550 is assembled with the latch 551 by a hinge pin 553, and the latch 551 is elastically supported in the locking direction of the socket lid 550 by the latch spring 552.

The pusher 560 is provided at the approximate center of the socket lid 550 and presses the IC by being in surface contact with the upper surface of the IC. Preferably, the pusher 560 is assembled with the socket lid 550 via a plurality of push springs 561, so a force of pressing the IC by the pusher 560 can be controlled by the elastic forces of the push springs 561.

Preferably, the pusher 560 may include a heat sink 570 on the upper part thereof, the heat sink being configured to discharge heat. Meanwhile, heat sink 570 may be heat sink fins formed to be integrated with the upper surface of the pusher 560.

As described above, the contact and socket device of the present disclosure are described by limited embodiments and drawings, but are not limited to this and may be modified or changed by those skilled in the art within the spirit of the art of the present disclosure and the range of the claims below.

What is claimed is:

1. A contact for testing a semiconductor IC, the contact being configured as one strip plate having predetermined width and thickness, the contact comprising:
    an upper terminal part having an upper tip part at an upper end part thereof; a lower terminal part having a lower tip part at a lower end part thereof and provided on the same axis as the upper terminal part; and an elastic part elastically supporting the upper terminal part and the lower terminal part,
    wherein each of the upper terminal part and the lower terminal part comprises a shoulder part formed by protruding therefrom in a width direction thereof, and
    the elastic part has a third width larger than a first width of the upper terminal part and a second width of the lower terminal part, and comprises a first strip and a second strip longitudinally formed along a center axis (a z axis) of the elastic part with a slot having a fourth width formed therebetween, wherein each of the first strip and the second strip has a same fifth width and is formed to be curved in a thickness direction opposite to each other, and the fifth width is the same as or larger than the thickness of the strip plate and is the same as or smaller than the fourth width.

2. The contact of claim 1, wherein the upper tip part or the lower tip part has at least one pointed contact point.

3. The contact of claim 1, wherein the upper terminal part or the lower terminal part is formed to have a hollow cylindrical shape by rolling and bending the plate, and the upper tip part or the lower tip part has a plurality of contact points formed by pointedly protruding along a circumference of an end part of a cylinder of the corresponding upper terminal part or lower terminal part.

4. The contact of claim 1, wherein the lower tip part is longer than the upper tip part.

5. The contact of claim 1, wherein the lower terminal part has a handling hole formed therethrough.

6. A contact for testing a semiconductor IC, the contact being configured as one strip plate having predetermined width and thickness, the contact comprising:
    an upper terminal part having an upper tip part at an upper end part thereof; a lower terminal part having a lower tip part at a lower end part thereof and provided on the same axis as the upper terminal part; and an elastic part elastically supporting the upper terminal part and the lower terminal part,
    wherein each of the upper terminal part and the lower terminal part comprises a shoulder part formed by protruding therefrom in a width direction thereof, and
    the elastic part has a third width larger than a first width of the upper terminal part and a second width of the lower terminal part, and comprises a first strip and a second strip longitudinally formed along a center axis (a z axis) of the elastic part with a slot having a fourth width formed therebetween, wherein each of the first strip and the second strip has a same fifth width and is formed to be curved in a same thickness direction thereof, and the fifth width is the same as or larger than the thickness of the strip plate and is the same as or smaller than the fourth width.

7. The contact of claim 6, wherein the upper tip part or the lower tip part has at least one pointed contact point.

8. The contact of claim 6, wherein the upper terminal part or the lower terminal part is formed to have a hollow cylindrical shape by rolling and bending the plate, and the upper tip part or the lower tip part has a plurality of contact points formed by pointedly protruding along a circumference of an end part of a cylinder of the corresponding upper terminal part or lower terminal part.

9. The contact of claim 6, wherein the lower tip part is longer than the upper tip part.

10. The contact of claim 6, wherein the lower terminal part has a handling hole formed therethrough.

11. A socket device for testing the semiconductor IC comprising the contact according to claims 1, the socket device comprising:
 a main body part having a first receiving hole formed therein, wherein the first receiving hole allows the upper tip part to be inserted therethrough and to be located to protrude therefrom and allows the contact to be compressed and moved downward; and
 a lower plate assembled with a lower end of the main body part and having a second receiving hole formed at a position corresponding to the first receiving hole, the second receiving hole allowing the lower tip part to protrude downward from the lower plate and to be held therein.

12. A socket device for testing the semiconductor IC comprising the contact according to claims 6, the socket device comprising:
 a main body part having a first receiving hole formed therein, wherein the first receiving hole allows the upper tip part to be inserted therethrough and to be located to protrude therefrom and allows the contact to be compressed and moved downward; and
 a lower plate assembled with a lower end of the main body part and having a second receiving hole formed at a position corresponding to the first receiving hole, the second receiving hole allowing the lower tip part to protrude downward from the lower plate and to be held therein.

13. A socket device for testing the semiconductor IC comprising the contact according to claim 1, the socket device comprising:
 a main body part having a first receiving hole formed therein and a plurality of mounting parts fixed to a printed circuit board (PCB), wherein the first receiving hole allows the upper tip part to be inserted therethrough and to be located to protrude therefrom and allows the contact to be compressed and moved downward;
 a lower plate assembled with a lower end of the main body part and having a second receiving hole formed at a position corresponding to the first receiving hole, the second receiving hole allowing the lower tip part to protrude downward from the lower plate and to be held therein;
 a floating plate having a contact hole formed at a position corresponding to the first receiving hole such that the upper terminal part is located in the contact hole, the floating plate being located to be spaced apart from an upper end of the main body part; and
 a plurality of floating springs elastically supporting the main body part and the floating plate.

14. The socket device of claim 13, further comprising:
 an IC holding part provided transversely on each of opposite ends of an upper side of the floating plate such that the IC holding part is elastically slidable, so that the IC holding part elastically supports each of opposite ends of the semiconductor IC loaded and seated on the floating plate.

15. The socket device of claim 13, wherein each of the mounting parts is formed by protruding and extending from a lower part of the main body part and has a column shape.

16. The socket device of claim 15, wherein the mounting part comprises: a through hole formed therethrough; a groove formed by cutting in a lower end part thereof; and a removal prevention protrusion formed on an outer circumferential surface thereof by protruding therefrom.

17. The socket device of claim 16, further comprising: a rivet pin inserted into the through hole.

18. The socket device of claim 13, wherein the floating plate comprises a ball terminal receiving hole formed to expand upward from the contact hole such that a terminal of the semiconductor IC is located in the ball terminal receiving hole.

19. The socket device of claim 13, further comprising:
 a cover part elastically supported on an upper part of the main body part and capable of moving vertically, and
 a pair of pressing means provided to be horizontally symmetrical to each other relative to the main body part and pressing the IC by operating in cooperation with the vertical movement of the cover part,
 wherein each of the pressing means comprises:
 a pusher configured to be in surface contact with and to press an upper surface of the IC sitting on the floating plate;
 a link assembled rotatably with the main body part by the first hinge shaft at a first end thereof and assembled rotatably with the pusher by a second hinge shaft at a second end thereof; and
 a latch assembled rotatably with the cover part by a third hinge shaft at a first end thereof and configured to be rotated by the second hinge shaft commonly used at a second end thereof, the latch being assembled rotatably with the pusher by a fourth hinge shaft spaced apart from the second hinge shaft.

20. The socket device of claim 19, wherein the pusher comprises a heat discharge part provided on an upper surface thereof and configured to discharge heat.

21. The socket device of claim 19, wherein the main body part further comprises an insert nut such that the main body part is mounted to the PCB.

22. The socket device of claim 19, wherein the floating plate comprises an IC seating guide part having a guide surface guiding a seating position of the IC.

23. The socket device of claim 13, further comprising:
 a base having a hinge part at a first end thereof and a latch holding step at a second thereof, the base being fixed to the main body part;
 a socket lid assembled rotatably with the hinge part and having a latch provided rotatably therein, the latch being held in the latch holding step; and
 a pusher provided in the socket lid and pressing an upper surface of the semiconductor IC.

24. The socket device of claim 23, wherein the pusher comprises a heat discharge part on an upper surface thereof, the heat discharge part being configured to discharge heat.

25. The socket device of claim 23, further comprising:
 a plurality of push springs provided between the socket lid and the pusher so as to allow the pressing force of the pusher to be applied.

26. The socket device of claim 23, wherein the base comprises an insert nut such that the base is mounted to the PCB.

27. The socket device of claim 23, wherein the floating plate comprises an IC seating guide part having a guide surface guiding a seating position of the IC.

28. The socket device of claim 23, wherein the main body part is integrated with the base.

29. A socket device for testing the semiconductor IC comprising the contact according to claim 6, the socket device comprising:
- a main body part having a first receiving hole formed therein and a plurality of mounting parts fixed to a printed circuit board (PCB), wherein the first receiving hole allows the upper tip part to be inserted therethrough and to be located to protrude therefrom and allows the contact to be compressed and moved downward;
- a lower plate assembled with a lower end of the main body part and having a second receiving hole formed at a position corresponding to the first receiving hole, the second receiving hole allowing the lower tip part to protrude downward from the lower plate and to be held therein;
- a floating plate having a contact hole formed at a position corresponding to the first receiving hole such that the upper terminal part is located in the contact hole, the floating plate being located to be spaced apart from an upper end of the main body part; and
- a plurality of floating springs elastically supporting the main body part and the floating plate.

30. The socket device of claim 29, further comprising:
an IC holding part provided transversely on each of opposite ends of an upper side of the floating plate such that the IC holding part is elastically slidable, so that the IC holding part elastically supports each of opposite ends of the semiconductor IC loaded and seated on the floating plate.

31. The socket device of claim 29, wherein each of the mounting parts is formed by protruding and extending from a lower part of the main body part and has a column shape.

32. The socket device of claim 31, wherein the mounting part comprises: a through hole formed therethrough; a groove formed by cutting in a lower end part thereof; and a removal prevention protrusion formed on an outer circumferential surface thereof by protruding therefrom.

33. The socket device of claim 32, further comprising: a rivet pin inserted into the through hole.

34. The socket device of claim 29, wherein the floating plate comprises a ball terminal receiving hole formed to expand upward from the contact hole such that a terminal of the semiconductor IC is located in the ball terminal receiving hole.

35. The socket device of claim 29, further comprising:
- a cover part elastically supported on an upper part of the main body part and capable of moving vertically, and
- a pair of pressing means provided to be horizontally symmetrical to each other relative to the main body part and pressing the IC by operating in cooperation with the vertical movement of the cover part, wherein each of the pressing means comprises:
- a pusher configured to be in surface contact with and to press an upper surface of the IC sitting on the floating plate;
- a link assembled rotatably with the main body part by the first hinge shaft at a first end thereof and assembled rotatably with the pusher by a second hinge shaft at a second end thereof; and
- a latch assembled rotatably with the cover part by a third hinge shaft at a first end thereof and configured to be rotated by the second hinge shaft commonly used at a second end thereof, the latch being assembled rotatably with the pusher by a fourth hinge shaft spaced apart from the second hinge shaft.

36. The socket device of claim 35, wherein the pusher comprises a heat discharge part provided on an upper surface thereof and configured to discharge heat.

37. The socket device of claim 35, wherein the main body part further comprises an insert nut such that the main body part is mounted to the PCB.

38. The socket device of claim 35, wherein the floating plate comprises an IC seating guide part having a guide surface guiding a seating position of the IC.

39. The socket device of claim 29, further comprising:
- a base having a hinge part at a first end thereof and a latch holding step at a second thereof, the base being fixed to the main body part;
- a socket lid assembled rotatably with the hinge part and having a latch provided rotatably therein, the latch being held in the latch holding step; and
- a pusher provided in the socket lid and pressing an upper surface of the semiconductor IC.

40. The socket device of claim 39, wherein the pusher comprises a heat discharge part on an upper surface thereof, the heat discharge part being configured to discharge heat.

41. The socket device of claim 39, further comprising:
a plurality of push springs provided between the socket lid and the pusher so as to allow the pressing force of the pusher to be applied.

42. The socket device of claim 39, wherein the base comprises an insert nut such that the base is mounted to the PCB.

43. The socket device of claim 39, wherein the floating plate comprises an IC seating guide part having a guide surface guiding a seating position of the IC.

44. The socket device of claim 39, wherein the main body part is integrated with the base.

45. A socket device for testing a semiconductor IC, the socket device comprising:
- a contact comprising: an upper terminal part having an upper tip part at an upper end part thereof; a lower terminal part having a lower tip part at a lower end part thereof and being assembled with the upper terminal part by crossing each other in a longitudinal direction of the contact; and a spring fitted over the upper terminal part and the lower terminal part therebetween and elastically supporting the upper terminal part and the lower terminal part;
- a main body part having a first receiving hole formed therein and a plurality of mounting parts fixed to a printed circuit board (PCB), wherein the first receiving hole allows the upper tip part to be inserted therethrough and to be located to protrude therefrom and allows the contact to be compressed and moved downward;
- a lower plate assembled with a lower end of the main body part and having a second receiving hole formed at a position corresponding to the first receiving hole, the second receiving hole allowing the lower tip part to protrude downward from the lower plate and to be held therein;
- a floating plate having a contact hole formed at a position corresponding to the first receiving hole such that the upper terminal part is located in the contact hole, the floating plate being located to be spaced apart from an upper end of the main body part; and
- a plurality of floating springs elastically supporting the main body part and the floating plate.

46. The socket device of claim 45, further comprising:
an IC holding part provided transversely on each of opposite ends of an upper side of the floating plate such that the IC holding part is elastically slidable, so that the IC holding part elastically supports each of opposite ends of the semiconductor IC loaded and seated on the floating plate.

47. The socket device of claim 45, wherein each of the mounting parts is formed by protruding and extending from a lower part of the main body part and has a column shape.

48. The socket device of claim 45, wherein the mounting part comprises: a through hole formed therethrough; a groove formed by cutting in a lower end part thereof; and a removal prevention protrusion formed on an outer circumferential surface thereof by protruding therefrom.

49. The socket device of claim 48, further comprising: a rivet pin inserted into the through hole.

50. The socket device of claim 45, wherein the floating plate comprises a ball terminal receiving hole formed to expand upward from the contact hole such that a terminal of the semiconductor IC is located in the ball terminal receiving hole.

\* \* \* \* \*